United States Patent
Yamasaki et al.

(10) Patent No.: US 6,339,357 B1
(45) Date of Patent: *Jan. 15, 2002

(54) SEMICONDUCTOR INTEGRATED CIRCUIT DEVICE CAPABLE OF EXTERNALLY MONITORING INTERNAL VOLTAGE

(75) Inventors: Kyoji Yamasaki; Takashi Itou, both of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/023,288

(22) Filed: Feb. 13, 1998

(30) Foreign Application Priority Data

Aug. 12, 1997 (JP) ................................. 9-217491

(51) Int. Cl.⁷ .................................. G05F 1/10
(52) U.S. Cl. .................... 327/538; 327/540; 327/407
(58) Field of Search ................. 327/530, 538, 327/540, 541, 543, 407, 403, 365, 404, 408; 323/313; 324/158.1, 763

(56) References Cited

U.S. PATENT DOCUMENTS

| | | | | |
|---|---|---|---|---|
| 4,551,634 A | * | 11/1985 | Takahashi et al. | 327/408 |
| 5,157,291 A | * | 10/1992 | Shimoda | 327/434 |
| 5,283,762 A | * | 2/1994 | Fujishima | 365/189.01 |
| 5,376,834 A | * | 12/1994 | Carobolante | 327/143 |
| 5,396,113 A | * | 3/1995 | Park et al. | 327/543 |
| 5,552,745 A | * | 9/1996 | Pelella et al. | 327/407 |
| 5,563,546 A | * | 10/1996 | Tsukada | 327/408 |
| 5,689,460 A | * | 11/1997 | Ooishi | 365/189.07 |
| 5,744,995 A | * | 4/1998 | Young | 327/407 |
| 5,789,966 A | * | 8/1998 | Bechade | 327/407 |

FOREIGN PATENT DOCUMENTS

| | | |
|---|---|---|
| JP | 60164269 A | 8/1985 |
| JP | 2-306179 | 12/1990 |
| JP | 6-215599 | 8/1994 |
| JP | 7-37381 | 2/1995 |

* cited by examiner

Primary Examiner—Timothy P. Callahan
Assistant Examiner—Hai L. Nguyen
(74) Attorney, Agent, or Firm—McDermott, Will & Emery

(57) ABSTRACT

A test on a desired internal voltage is easily and accurately conducted without increasing current dissipation or the number of pads. A driving circuit receiving a reference voltage from a reference voltage generating circuit has a high input impedance and low output impedance, and generates a voltage substantially at the same voltage level as the reference voltage received, and transmits the generated voltage to a pad with a current driving capability larger than the driving current capability of the reference voltage generating circuit.

17 Claims, 10 Drawing Sheets

SEMICONDUCTOR INTEGRATED CIRCUIT DEVICE CAPABLE OF EXTERNALLY MONITORING INTERNAL VOLTAGE

BACKGROUND OF THE INVENTION

1. Field of the Invention

The present invention relates to semiconductor integrated circuit devices, and particularly to a semiconductor integrated circuit device having at least a test mode for externally monitoring an internal voltage. Specifically, this invention relates to a semiconductor integrated circuit device having an internal power supply voltage generating circuit for generating an internal power supply voltage according to a reference voltage, and more specifically to a configuration permitting externally monitoring or externally changing the reference voltage.

2. Description of the Background Art

Now, as an example of the semiconductor integrated circuit device, a semiconductor memory device is considered. The semiconductor memory device has been made with higher integration and higher density to obtain an increased storage capacity, and accordingly, the elements or the components of the device have been miniaturized. To ensure the reliability of these miniaturized elements such as a MOS transistor (insulated gate type field effect transistor), the operating power supply voltage should be made low. Such a lowering of the operating power supply voltage can reduce the power dissipation which is proportional to the square of the operating power supply voltage. External logics and processors, however, have not been miniaturized to the degree of the semiconductor memory device. Therefore, the power supply voltage for those devices cannot be made as low as that for the semiconductor memory device, because their high-speed operation will not be ensured. In addition, the miniaturized memory devices must retain compatibility with previous-generation semiconductor memory devices.

Therefore, the power supply voltage provided from an outside of the semiconductor memory device, such as a system power supply voltage, is down converted within the device to generate an internal power supply voltage at a required voltage level.

FIG. 19 is a diagram showing an example of the configuration of a conventional internal power supply circuit. Referring to FIG. 19, the internal power supply circuit includes a reference voltage generating circuit RFG which generates reference voltage Vref at a prescribed voltage level, and an internal voltage down converter VDC which compares reference voltage Vref from the reference voltage generating circuit RFG with the voltage on an internal power supply line IVL, and according to the result of comparison, supplies current from an external power supply node EX onto internal power supply line IVL to adjust the voltage level on the internal power supply line IVL to generate an internal power supply voltage intVcc.

The internal voltage down converter VDC includes a comparator CMP for comparing reference voltage Vref with internal power supply voltage intVcc on internal power supply line IVL, and a drive transistor DR formed of a p channel MOS transistor and for supplying current from external power supply node EX onto internal power supply line IVL according to the output signal from the comparator CMP. Comparator CMP has a positive input receiving internal power supply voltage intvcc on internal power supply line IVL and a negative input receiving reference voltage Vref.

When internal power supply voltage intvcc is higher than reference voltage Vref, the internal voltage down converter VDC pulls up the output signal from comparator CMP to a high level for rendering drive transistor DR nonconductive to stop current supply from external power supply node EX to internal power supply line IVL. On the other hand, if internal power supply voltage intvcc on internal power supply line IVL is lower than reference voltage Vref, the comparator CMP outputs a signal at a low level, increasing the conductance of drive transistor DR, and thus the current in proportion to the difference between the internal power supply voltage intVcc and the reference voltage Vref from external power supply node EX is supplied to internal power supply line IVL through drive transistor DR. As a result, the voltage level of internal power supply voltage intvcc is maintained substantially at the same level as reference voltage Vref.

FIG. 20 is a diagram showing an example of the configuration of reference voltage generating circuit RFG shown in FIG. 19, which is described, for example, in Japanese Patent Laying-Open No. 7-37381.

Referring to FIG. 20, the reference voltage generating circuit RFG includes: a p channel MOS transistor P1 connected between external power supply node EX and a node M1 and having a gate receiving a ground voltage; an n channel MOS transistor N1 connected between node M1 and a ground node and having its gate connected to node M1; a p channel MOS transistor P2 connected between external power supply node EX and a node M2 and having its gate connected to node M2; an n channel MOS transistor N2 connected between node M2 and a ground node and having its gate connected to node M1; a p channel MOS transistor P3 connected between external power supply node EX and a node M4 and having its gate connected to node M2; a p channel MOS transistor P4 connected between node M4 and node M3 and having its gate connected to node M3; and an n channel MOS transistor N3 connected between node M3 and a ground node and having its gate connected to node M1.

The two p channel MOS transistors P2 and P3 constitute a current mirror circuit, and their size ratio (size being a ratio of gate width to gate length) is set to 1:1. Meanwhile, each of the n channel MOS transistors N2 and N3 constitutes a current mirror circuit with n channel MOS transistor N1. The gate width to gate length ratio of n channel MOS transistor N2 is set to one half (½) that of n channel MOS transistor N3.

The reference voltage generating circuit RFG further includes a p channel MOS transistor P5 connected between external power supply node EX and node M3 and having its gate connected to node M3, a p channel MOS transistor P6 connected between external power supply node EX and a node M5 and having its gate connected to node M4, and diode-connected p channel MOS transistors P7, P8 and P9 connected in series to one another between node M5 and a ground node.

The absolute value of threshold voltage of p channel MOS transistor P5 is set higher than that of p channel MOS transistor P4. The ratio of gate width to gate length of p channel MOS transistor P6 is set at the same value as that of each of p channel MOS transistors P7–P9. Now, the operation of reference voltage generating circuit RFG shown in FIG. 20 will be described in brief.

P channel MOS transistor P1 having its gate connected to the ground node serves as a current source and generates a reference current, which in turn is supplied to n channel MOS transistor N1. N channel MOS transistors N1 and N2 constituting a current mirror circuit have the same size with each other, so that current flowing through n channel MOS transistor N2 is the same in amount as the current flowing through n channel MOS transistor N1. N channel MOS transistor N2 is supplied with current from p channel MOS transistor P2, and the mirror current of the current flowing through p channel MOS transistor P2 flows through p channel MOS transistor P3. As p channel MOS transistors P2 and P3 have the same size with each other, the same amount of current flows therethrough. The current i from p channel MOS transistor P3 flows through p channel MOS transistor P4 and n channel MOS transistor N3 to the ground node.

The ratio of gate width to gate length of n channel MOS transistor N3 is set twice that of n channel MOS transistor N2, and thus the current 2i, twice the magnitude of current i flowing through p channel MOS transistors P3 and P4, flows through n channel MOS transistor N3. The remaining current i is supplied from p channel MOS transistor P5 to n channel MOS transistor N3. The absolute value of threshold voltage of p channel MOS transistor P5 is set greater than that of p channel MOS transistor P4. Now, assume that the absolute value of threshold voltage of p channel MOS transistor P4 is represented by Vthp4, and the absolute value of threshold voltage of p channel MOS transistor P5 is represented by Vthp5. In this situation, as p channel MOS transistor P5 is operating in a diode mode, the voltage V(M3) of node M3 is represented by the following expression:

V(M3)=extVcc−Vthp5.

Meanwhile, as p channel MOS transistor P4 is also operating in a diode mode, the voltage of node M4, V(M4) is expressed as follows:

V(M4)=V(M3)+Vthp4=extVcc−(Vthp5−Vthp4).

Node M4 is connected to the gate of p channel MOS transistor P6, and thus p channel MOS transistor P6 supplies a constant current ir according to the constant voltage on nodes M4. Each of p channel MOS transistors P7–P9 has the same size as the p channel MOS transistor P6, and therefore each of these p channel MOS transistors P7–P9 generates the same gate-to-source voltage as p channel MOS transistor P6 does. That is, the source-to-gate voltage of p channel MOS transistor P6 is Vthp5−Vthp4, and each of p channel MOS transistors P7–P9 causes a voltage drop at the same voltage level as Vthp5−Vthp4. Therefore, the reference voltage Vref from node M5 is expressed by the following equation:

Vref=3(Vthp5−Vthp4).

This reference voltage Vref is determined based on the difference between the absolute values of threshold voltages of p channel MOS transistors P4 and P5, and becomes a constant voltage independent of external power supply voltage extVcc, provided that the external power supply voltage extVcc is higher than a predetermined voltage level and that all the p channel MOS transistors P7–P9 are conductive. Internal power supply voltage intVcc is set essentially at the same voltage level as reference voltage Vref. Therefore, the voltage level of internal power supply voltage intVcc, used as the operating power supply voltage for internal circuitry, attains a constant voltage level independent of the voltage level of external power supply voltage extvcc.

Reference voltage generating circuit RFG shown in FIG. 20 has reference current ir made considerably small in value in order to keep power dissipation sufficiently small. In the reference voltage generating circuit RFG configured as shown in FIG. 20, current ir supplied from p channel MOS transistor P6 flows through p channel MOS transistors P7–P9, causing a constant voltage drop at each of p channel MOS transistors P7–P9, and thus reference voltage Vref at a constant voltage level is generated. Accordingly, reference voltage generating circuit RFG shown in FIG. 20 has no current supplying capability for an external load. If current ir supplied from p channel MOS transistor P6 flows into an external load, the current value flowing through p channel MOS transistors P7–P9 will change, and the voltage level of reference voltage Vref will change consequently. Therefore, in the case a noise occurs on node M5, it will not be absorbed (because of the absence of current supply), making the configuration extremely susceptible to noise.

If noise is not absorbed, the voltage level of reference voltage Vref will vary, and accordingly the voltage level of internal power supply voltage intVcc will vary.

In the configuration of reference voltage generating circuit RFG as illustrated in FIG. 20, a resistance element can be connected between node M5 and a ground node. In this case, reference voltage Vref is determined by both reference current ir and the resistance value of the resistance element. In this case, the resistance value of the resistance element is made extremely high in order to make current consumption sufficiently small. Therefore, the configuration that utilizes the resistance element in order to generate the reference voltage also has considerably small current supplying capability, and thus has a disadvantage that it is susceptible to noise at the output node. Several tests are conducted for semiconductor memory devices. The reference voltage Vref is externally monitored in a test mode for tuning the voltage level of internal power supply voltage intVcc. Further, a test for measuring an estimation parameter (such as operating margin) of the semiconductor memory device is performed. In these test modes, the following problems arise in the conventional reference voltage generation circuit.

FIG. 21 is a diagram schematically showing an arrangement for externally monitoring the voltage level of reference voltage Vref generated by reference voltage generating circuit RFG. Referring to FIG. 21, on the semiconductor chip CH where the semiconductor memory device is formed, a pad PD is arranged in the vicinity of reference voltage generating circuit RFG. The pad PD is connected through an interconnection line SG to the output node of reference voltage generating circuit RFG. Pad PD is a test-dedicated pad, and is not connected to a lead terminal after packaging. A test probe PB from a tester TU is contacted to the pad formed on the semiconductor chip CH, and the voltage level on pad PD is monitored.

When the tester TU has a voltmeter connected to the test probe PB, reference voltage generating circuit RFG having no current supplying capability cannot sufficiently charge the path from pad PD through test probe PB to the voltmeter in tester TU, and therefore, the voltage level of reference voltage Vref cannot be measured in tester TU accurately.

There is another way of measuring the voltage level of reference voltage Vref generated from reference voltage generating circuit RFG, in which pad PD is provided with current from test probe PB using the tester TU, and the voltage level is measured dependent on whether or not current flows through the test probe PB. In this case, the current supplied from tester TU through test probe PB will be transmitted through pad PD and interconnection line SG to the output node of reference voltage generating circuit RFG. Reference voltage generating circuit RFG is essentially a voltage follower circuit with a small output impedance. Therefore, the current supplied by test probe PB flows into the output node and causes the voltage level of reference voltage Vref to change, thereby making it difficult to measure the level of reference voltage Vref accurately.

Further, this test is carried out on a semiconductor chip CH present on a wafer, with test probe PB from tester TU connected to pad PD. When testing, a jig called a test card is employed to allow test probes to contact with all the pads formed on a semiconductor chip CH. Therefore, noise from these test probes, such as a cross-talk is transmitted to pad PD, causing the voltage level of reference voltage Vref of reference voltage generating circuit RFG to change, thereby making it difficult to measure the voltage level with accuracy.

FIG. 22 is a diagram schematically showing the overall configuration of a semiconductor memory device. Referring to FIG. 22, the semiconductor memory device includes a memory cell array MA having a plurality of memory cells arranged in a matrix of rows and columns, a sense amplifier band SAB having a plurality of sense amplifier circuits provided corresponding to respective columns of memory cell array MA, to sense, amplify and latch the data of the memory cells read out on the corresponding columns when activated, a peripheral circuit PC for making an access to memory cell array MA, and a sense amplifier control circuit SAC for controlling the sense amplifier circuits in sense amplifier band SAB. The peripheral circuit PC may include a row decoder for selecting a row and an internal write/read circuit for writing/reading data. It may also include circuits for generating various control signals.

A peripheral circuit dedicated internal power supply circuit IGP is provided for peripheral circuit PC, and a sense amplifier dedicated internal power supply circuit IGS is provided for sense amplifier control circuit SAC. In the vicinity of the peripheral circuit dedicated internal power supply circuit IGP and sense amplifier dedicated internal power supply circuit IGS, pads PDP and PDS are disposed respectively. Peripheral circuit dedicated internal power supply circuit IGP and sense amplifier dedicated internal power supply circuit IGS each include both reference voltage generating circuit RFG and internal voltage down converter VDC shown in FIG. 19. However, the level of the internal power supply voltage output from peripheral circuit dedicated internal power supply circuit IGP is set slightly higher in order to permit peripheral circuit PC to operate at high speed.

The internal power supply voltage fed by sense amplifier control circuit SAC for driving sense amplifier band SAB (sense amplifier power supply voltage) is set lower than that supplied to peripheral circuit PC in order to ensure the reliability of the memory cell transistors in memory cell array MA. As a result, the internal power supply voltage output from sense amplifier dedicated internal power supply circuit IGS is set at a voltage level lower than the internal power supply voltage output from peripheral circuit dedicated internal power supply circuit IGP. In memory cell array MA, the voltage transmitted onto a selected word line is (normally 1.5 times) higher than the operating power supply voltage, and accordingly, the voltage level to be transmitted into memory cell array MA is set low in order to prevent the gate insulating film of each memory cell transistor (MOS transistor) from suffering a dielectric breakdown when the boosted voltage is applied.

As illustrated in FIG. 22, pads for monitoring the reference voltage, PDP and PDS, are arranged respectively for peripheral circuit dedicated internal power supply circuit IGP and sense amplifier dedicated internal power supply circuit IGS. These pads PDP and PDS are for use in a wafer level test, and not used after packaging. Therefore, a problem arises with respect to the semiconductor memory device that the chip area cannot be reduced because of the large area occupied by pads PDP and PDS. In addition, if the number of the required pads increases, it will become more complicated to align the pads with test probes in testing, and will consequently lower the efficiency of the testing operation.

The problem that the number of pads increases will be encountered not only where monitoring the reference voltage for generating an internal power supply voltage, but also where externally monitoring the voltage levels of internal voltages generated in the semiconductor memory device, such as a bit line precharge voltage, a cell plate voltage, a substrate bias voltage, an internal power supply voltage, and a word line driving voltage.

Moreover, the problem associated with externally monitoring an internal voltage is experienced not only in the semiconductor memory device, but also in other semiconductor integrated circuit devices including logics.

Furthermore, the problem with the pad number will also arise when the "force" test is conducted for measuring the operating margin and others of an internal circuit by externally setting the level of a desired internal voltage to a desirable voltage level.

SUMMARY OF THE INVENTION

It is an object of the present invention to provide a semiconductor integrated circuit device capable of easily conducting a test on a desired internal voltage with accuracy.

It is another object of this invention to provide a semiconductor integrated circuit device capable of externally monitoring as well as externally setting the internal voltage accurately.

It is still another object of the present invention to provide a semiconductor integrated circuit device capable of easily conducting a test on a plurality of internal voltages without increasing the chip area.

It is a further object of the present invention to provide a semiconductor integrated circuit device capable of easily and accurately conducting a test on a reference voltage used for generating an internal power supply voltage without increasing the chip occupation area.

The semiconductor integrated circuit device according to an aspect of the present invention includes at least one reference voltage generating circuitry, internal power supply voltage generating circuitry for comparing a voltage corresponding to the reference voltage generated by the at least one reference voltage generating circuitry with a voltage on an internal power supply line to adjust the voltage level on the internal power supply line according to the result of comparison, a pad, and driving circuitry provided between the pad and an output of the at least one reference voltage generating circuitry for receiving the reference voltage output from the at least one reference voltage generating circuitry to generate a voltage substantially at the same level as the received reference voltage for transmission to the pad.

The semiconductor integrated circuit device according to another aspect of the invention includes a plurality of voltage transmitting lines each having an internal voltage at a predetermined voltage level transmitted thereon, a pad, and connecting circuitry provided between the pad and each of the plurality of voltage transmitting lines, and responsive to a select signal for electrically connecting the pad to a voltage transmitting line designated by the select signal.

The semiconductor integrated circuit device according to a further aspect of the invention includes a plurality of voltage transmitting lines each having an internal voltage at a predetermined voltage level transmitted thereon, a pad, connecting circuitry provided between each of the plurality of voltage transmitting lines and a first internal node, and responsive to a select signal for electrically connecting the pad to a voltage transmitting line designated by the select signal, and driving circuitry provided between the first internal node and the pad, and for receiving the voltage on the voltage transmitting line selected by the connecting circuitry to generate a voltage substantially at the same level as the received voltage for transmission to the pad.

By providing driving circuitry between the pad and the output of the reference voltage generating circuit having an extremely small current supplying capability, influence of the noise at the pad on the reference voltage generating circuit can be prevented. Also, by driving the pad by driving circuitry, the pad can be driven with a relatively large current supplying capability, and thus the level of the reference voltage can be externally monitored reliably.

Furthermore, by providing a plurality of internal voltage transmitting lines with connecting circuitry for selective connection with the pad, a test on a plurality of internal voltages can be conducted using a single pad. Accordingly, increase in the number of pads is suppressed to restrict an increase in a chip occupation area, and also the contact of the test probes of the test card with the pad will be made easier, and therefore the operation upon the testing can be simplified.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
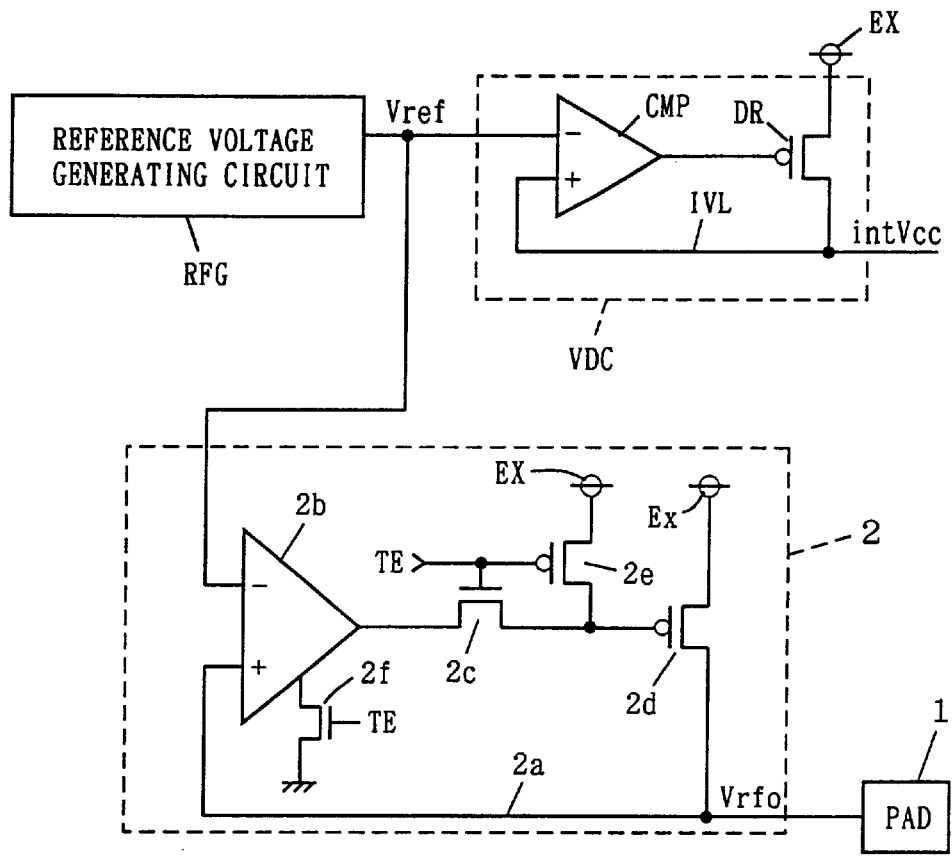
FIG. 1 is a diagram showing the configuration of a main portion of a semiconductor integrated circuit device according to a first embodiment of the present invention.

FIG. 1 is a diagram showing the configuration of a main portion of a semiconductor memory device according to a first embodiment of the present invention. Referring to FIG. 1, the internal power supply circuit includes, as in a conventional one, a reference voltage generating circuit RFG for generating a reference voltage Vref, and an internal voltage down converter VDC for generating an internal power supply voltage intVcc on an internal power supply line IVL according to the reference voltage Vref from the reference voltage generating circuit RFG. The internal voltage down converter VDC includes a comparator CMP for comparing the reference voltage Vref with the internal power supply voltage intvcc on the internal power supply line IVL, and a drive transistor DR for supplying current from an external power supply node EX to the internal power supply line IVL according to the output signal from the comparator CMP.

The reference voltage generating circuit RFG has an extremely small capability of supplying current to its output node so as to reduce current dissipation, and thus it can provide only considerably weak current from its output node. Comparator CMP, formed of a differential amplifying circuit with an extremely high input impedance, has a voltage driven type input. Therefore, even if the current supplying capability of the reference voltage Vref from reference voltage generating circuit RFG is extremely small, the load associated with the output of the reference voltage generating circuit RFG is small, so that a stable reference voltage Vref can be generated.

The semiconductor memory device in FIG. 1 further includes a driving circuit 2 connected between reference voltage generating circuit RFG and a pad 1 for generating a voltage Vrfo substantially at the same voltage level as the reference voltage Vref output from reference voltage generating circuit RFG for transmission to pad 1. The driving circuit 2 is activated when a test mode designating signal TE is activated, to generate with a relatively large current driving capability a voltage Vrfo at a voltage level corresponding to the reference voltage Vref and transmits thus generated voltage Vrfo to the pad 1. Pad 1 is contacted with a test probe from a tester at the time of a wafer level test, and is not connected to any lead frame after packaging.

Driving circuit 2 includes: a comparator 2b formed of a differential amplifying circuit, for comparing a voltage on a signal line 2a electrically connected to pad 1 with reference voltage Vref; a transfer gate 2c formed of an n channel MOS transistor, for becoming conductive when test mode designating signal TE is activated (or brought to an H level) to transmit the output signal of the comparator (hereinafter referred to as a differential amplifying circuit) 2b; a drive transistor 2d formed of a p channel MOS transistor, for supplying current from an external power supply node EX to signal line 2a according to the output signal of differential amplifying circuit 2b provided through transfer gate 2c; a transfer gate 2e formed of a p channel MOS transistor, for becoming non-conductive when test mode designating signal TE is activated, to electrically isolate the gate of drive transistor 2d from external power supply node EX; and a current source transistor 2f composed of an n channel MOS transistor, for becoming conductive when test mode designating signal TE is activated, to activate differential amplifying circuit 2b.

In an operation mode other than the test mode for monitoring the voltage Vrfo of the pad 1, test mode designating signal TE is set to an inactive L (logical low) level and transfer gate 2e becomes conductive. At this time, the gate potential of drive transistor 2d is brought to the level equal to that of the external power supply voltage provided to external power supply node EX, and drive transistor 2d is turned off.

Differential amplifying circuit 2b has a positive input receiving voltage Vrfo on signal line 2a and a negative input receiving reference voltage Vref from reference voltage generating circuit RFG. In the test mode, current source transistor 2f and transfer gate 2c are both on, and transfer gate 2e is off. When voltage Vrfo on signal line 2a is higher than reference voltage Vref, the output signal of differential amplifying circuit 2b attains a high level and drive transistor 2d is turned off. On the other hand, when reference voltage Vref is higher than the output voltage Vrfo, the output signal of differential amplifying circuit 2b attains a low level, increasing the conductance of drive transistor 2d, and thus current is supplied from external power supply node EX to signal line 2a and the voltage level of output voltage Vrfo is raised. Therefore, the voltage level of output voltage Vrfo provided from signal line 2a onto pad 1 is made substantially equal to the voltage level of reference voltage Vref output from reference voltage generating circuit RFG.

Differential amplifying circuit 2b, whose configuration will be described later, has a high input impedance, and electrically isolates reference voltage generating circuit RFG from pad 1. Accordingly, if noise occurs on pad 1, it will be blocked at driving circuit 2 and prevented from being transmitted to the output of reference voltage generating circuit RFG, so that reference voltage Vref can be stably output from reference voltage generating circuit RFG. In addition, drive transistor 2d has a relatively large current supplying capability (compared to that of reference voltage generating circuit RFG). Accordingly, if noise occurs on pad 1 and the voltage level of output voltage Vrfo drops, the noise is compensated for by a feedback loop of differential amplifying circuit 2b and drive transistor 2d and thus the voltage level of output voltage Vrfo returns to a predetermined voltage level (i.e. Vref level). Therefore, even if a test probe is applied to pad 1, driving circuit 2 can transmit with a relatively large current driving capability the output voltage Vrfo through the test probe to a voltmeter provided in the tester, and thus the voltage level of output voltage Vrfo can be measured with the voltmeter accurately. At this time, in the case that noise occurs from the test probe and the voltage level of output voltage Vrfo varies, the feedback loop of differential amplifying circuit 2b and drive transistor 2d will absorb the noise and the voltage level of output voltage Vrfo will be kept at a constant voltage level, so that the test can be carried out with accuracy.

The voltage level of output voltage Vrfo of pad 1 is substantially identical to that of reference voltage Vref generated by reference voltage generating circuit RFG. Therefore, by externally monitoring the voltage level of output voltage Vrfo, it can be identified whether or not reference voltage generating circuit RFG is generating reference voltage Vref at a predetermined voltage level correctly. Based on the result of identification, trimming operation within reference voltage generating circuit RFG is carried out to set reference voltage Vref to the predetermined voltage level (normally the output voltage level is adjustable by means of a fuse element), so that reference voltage Vref at the predetermined voltage level can be generated.

Current source transistor 2f of differential amplifying circuit 2b becomes conductive only when test mode designating signal TE is activated, to form a current path of the differential amplifying circuit 2b, and enables the differential amplifying operation of differential amplifying circuit 2b. That is, only in this test mode (for monitoring the voltage level of output voltage Vrfo at pad 1), driving circuit 2 operates and consumes current. (Drive transistor 2d is in an off state when test mode designating signal TE is inactive.) Therefore, in a normal operating mode (i.e. mode other than that for monitoring the voltage level of output voltage Vrfo on pad 1), driving circuit 2 remains in an inactive state, consumes no current, and accordingly, unnecessary current dissipation in the semiconductor memory device is suppressed.

Configuration of Differential Amplifying Circuit

Figure 2:
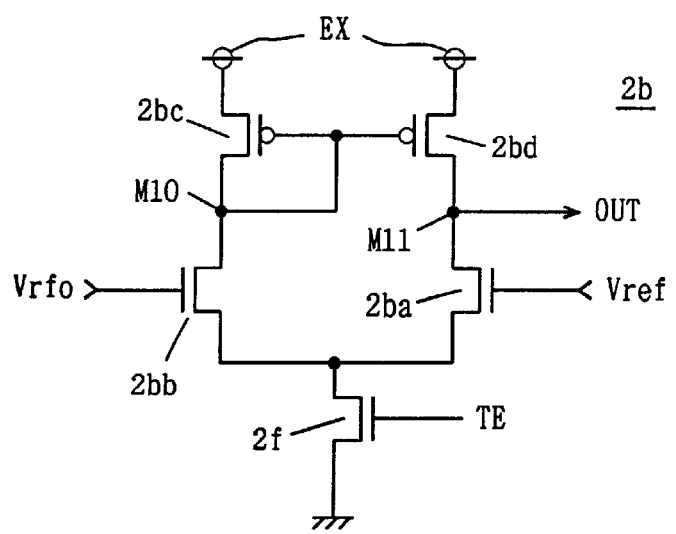
FIG. 2 is a diagram showing an example of the configuration of the comparator shown in FIG. 1.

FIG. 2 is a diagram showing an example of the configuration of differential amplifying circuit 2b shown in FIG. 1. Referring to FIG. 2, differential amplifying circuit 2b includes an n channel MOS transistor 2ba having a gate receiving reference voltage Vref, an n channel MOS transistor 2bb having a gate receiving output voltage Vrfo, a p channel MOS transistor 2bc supplying current from external power supply node EX to n channel MOS transistor 2bb, and a p channel MOS transistor 2bd supplying current from external power supply node EX to n channel MOS transistor 2ba. The gate of p channel MOS transistor 2bc is connected to its drain node M10. Accordingly, p channel MOS transistors 2bc and 2bd constitute a current mirror circuit, and the currents of the same amount flow through these p channel MOS transistors 2bc and 2bd, respectively. The source nodes of n channel MOS transistors 2ba and 2bb are commonly connected to the drain of current source transistor 2f.

If reference voltage Vref is higher than output voltage Vrfo, the conductance of n channel MOS transistor 2ba attains higher than that of n channel MOS transistor 2bb, so that more current is allowed to flow through n channel MOS transistor 2ba than through n channel MOS transistor 2bb. To n channel MOS transistor 2bb, current is supplied via p channel MOS transistor 2bc, while the same amount of current is supplied to n channel MOS transistor 2ba via P channel MOS transistor 2bd. As a result, n channel MOS transistor 2ba discharges all the current supplied from p channel MOS transistor 2bd and lowers the voltage level of an output signal OUT from node M11.

On the other hand, if reference voltage Vref is lower than output voltage Vrfo, the amount of the current allowed to flow through MOS transistor 2bb will increase, hindering n channel MOS transistor 2ba from discharging all the current supplied from p channel MOS transistor 2bd, and thus the voltage level of signal OUT from output node M11 is raised. Node M11 is electrically connected to one conduction node of transfer gate 2c illustrated in FIG. 1.

As shown in FIG. 2, differential amplifying circuit 2b includes MOS transistors having gates receiving reference voltage Vref and output voltage Vrfo respectively, which gates are electrically separated from each other (due to the gate insulating films of MOS transistors 2ba and 2bb). Because of this configuration, reference voltage Vref is protected against the adverse effect of the noise on output voltage Vrfo, and thus a stable reference voltage Vref at a predetermined voltage level can be generated by reference voltage generating circuit RFG without fail. In addition, driving circuit 2 is capable of generating output voltage Vrfo through a relatively large current driving capability of drive transistor 2d.

Second Embodiment

Figure 3:
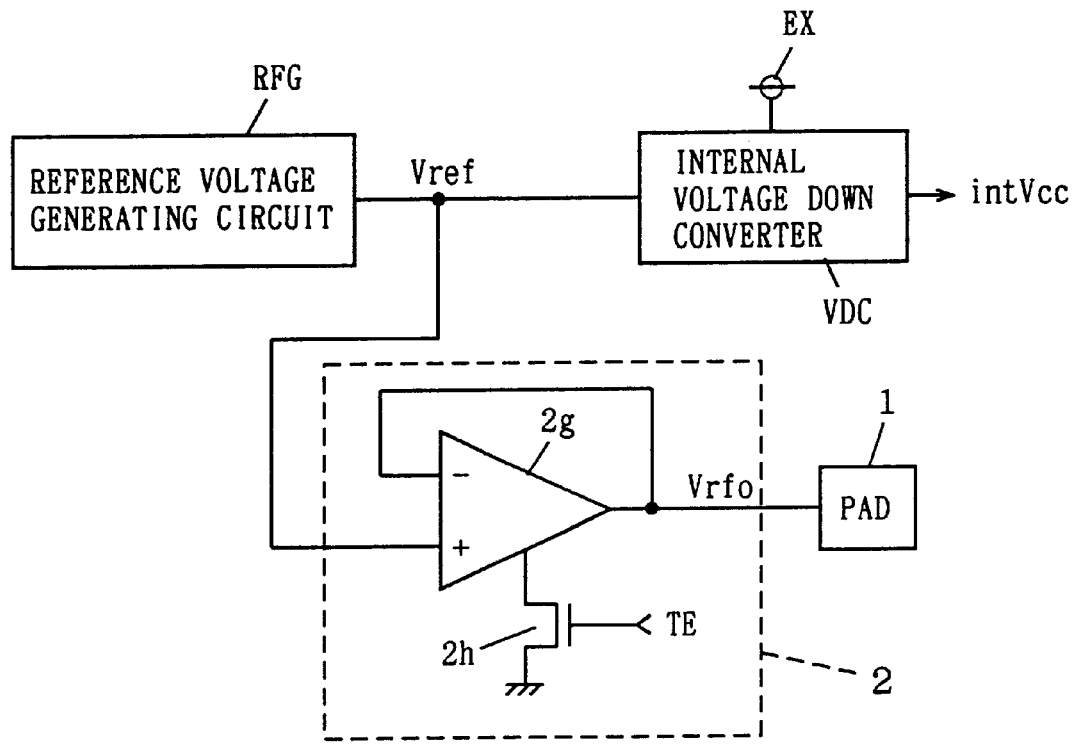
FIG. 3 is a diagram schematically showing the configuration of a main portion of a semiconductor integrated circuit device according to a second embodiment of the present invention.

FIG. 3 is a diagram showing the configuration of a main portion of a semiconductor memory device according to the second embodiment of the present invention. The semiconductor memory device shown in FIG. 3 is identical to that shown in FIG. 1, except for that the driving circuit 2 provided between the output of reference voltage generating circuit RFG and pad 1 is a voltage follower type differential amplifying circuit. More specifically, driving circuit 2 according to the second embodiment of the present invention includes a differential amplifying circuit 2g having its output and negative input interconnected to each other and having a positive input receiving reference voltage Vref from reference voltage generating circuit RFG, and a current source transistor 2h for becoming conductive when test mode designating signal TE is activated, to form a current path to differential amplifying circuit 2g to activate differential amplifying circuit 2g. The voltage Vrfo output from differential amplifying circuit 2g is transmitted to pad 1.

The differential amplifying circuit, with its output and negative input interconnected, has an open-loop gain A being set extremely high. In this case, the relation between the input reference voltage Vref and output voltage Vrfo is represented by the following equation:

$$Vrfo/Vref = A/(1+A) \sim 1.$$

Accordingly, the voltage level of the output voltage Vrfo is made substantially equal to that of reference voltage Vref being input. In this voltage follower type differential amplifying circuit, the effective closed-loop impedance $\Delta V/\Delta I$ is equal to $A \cdot Z$ and is extremely large, where Z is an impedance to ground of the negative input or positive input terminal. The output impedance is extremely small. Hence, even if the current amount supplied by reference voltage generating circuit RFG is considerably small, output voltage Vrfo can be generated with a large current supplying capability owing to the voltage follower type differential amplifying circuit 2g, and therefore, the voltage level of reference voltage Vref can be externally monitored through output voltage Vrfo easily and accurately without influence of noise.

Figure 4:
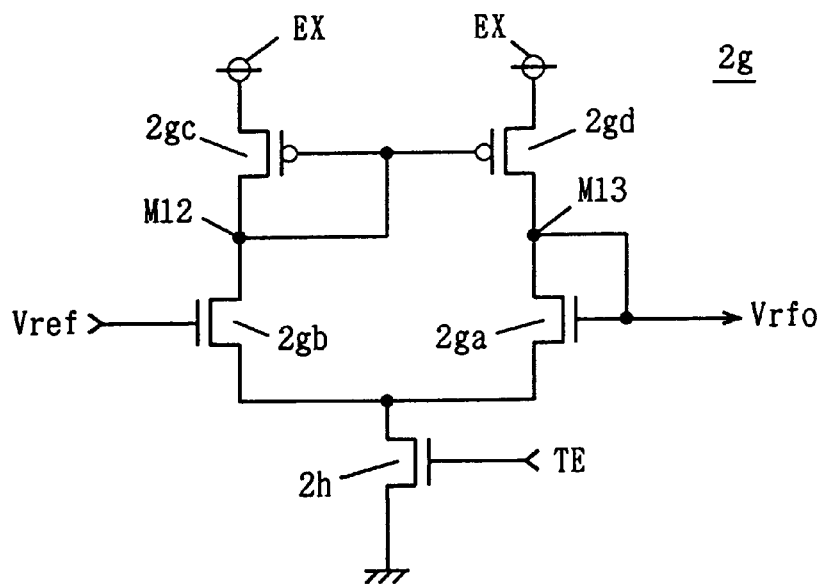
FIG. 4 is a diagram showing an example of the configuration of the comparator shown in FIG. 3.

FIG. 4 shows the configuration of the differential amplifying circuit 2g shown in FIG. 3. Referring to FIG. 4, differential amplifying circuit 2g includes n channel MOS transistors 2ga and 2gb constituting the differential amplifying stage for comparing reference voltage Vref with output voltage Vrfo, and p channel MOS transistors 2gc and 2gd constituting the current mirror stage for supplying current to the MOS transistors 2gb and 2ga. The sources of MOS transistors 2ga and 2gb are commonly connected to the drain of current source transistor 2h receiving the test mode designation signal at a gate thereof. The drain and the gate of MOS transistor 2ga are interconnected to an output node M13. MOS transistor 2gc has its gate and drain interconnected to node M12 and acts as the master of the current mirror stage.

When test mode designating signal TE is at an inactive L level, current source transistor 2h is in an off state, and thus there is no current path between external power supply node EX and a ground node in differential amplifying circuit 2g. Accordingly, the voltage level of output node M13 is kept at the external power supply voltage level.

When test mode designating signal TE is activated, current source transistor 2h is turned on, and the differential amplifying operation of differential amplifying circuit 2g is enabled. When reference voltage Vref is higher than output voltage Vrfo, current of a large amount is allowed to flow through MOS transistor 2gb, and its mirror current is supplied to MOS transistor 2ga through MOS transistor 2gd. As a result, the voltage level of node M13, or output voltage Vrfo increases. In response to the increase of this voltage level, the conductance of MOS transistor 2ga becomes higher and restricts the increase of voltage level of node M13.

Meanwhile, if output voltage Vrfo is higher than reference voltage Vref, MOS transistor 2ga supplies a large amount of current, and causes the voltage level of node M13 to drop. As a result, the voltage level of output voltage Vrfo drops, the conductance of MOS transistor 2ga decreases, and thus the decrease of the voltage level of node M13 is restricted. Therefore, the voltage levels of reference voltage Vref and output voltage Vrfo become equal to each other. In the case that noise occurs on node M13, the conductance of MOS transistor 2ga will change due to the noise and the direction of the current flowing through MOS transistor 2ga will change so as to cancel the nose on node M13, and thus the noise is absorbed.

As discussed above, according to the second embodiment of the present invention, the configuration of transmitting the output voltage of the reference voltage generating circuit to a pad through a voltage follower type differential amplifying circuit can be considered as an equivalent to the configuration in which the reference voltage generating circuit and the pad are electrically isolated. Therefore, an adverse effect of the noise at the pad on the output voltage of the reference voltage generating circuit can be avoided, and thus the voltage level of the reference voltage generated by the reference voltage generating circuit can be measured accurately through the measurement of the output voltage of the differential amplifying circuit.

In addition, employment of only one voltage follower type differential amplifying circuit leads to a reduced number of components in a circuit, and accordingly the area occupied by a circuit can be reduced.

Furthermore, as this embodiment employs the voltage follower type differential amplifying circuit capable of converting the impedance and changing the current supply amount, even though the current supplying capability of the reference voltage generating circuit is extremely small, the pad can be driven with a relatively large current supplying capability, and thus the voltage level on the pad can be externally measured with accuracy.

Test Mode Setting Circuit

Figure 5A:
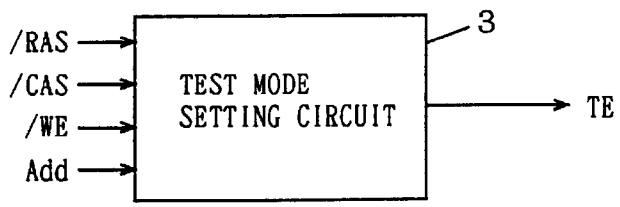
FIG. 5A schematically shows the configuration of a test mode designating signal generating portion.
Figure 5B:
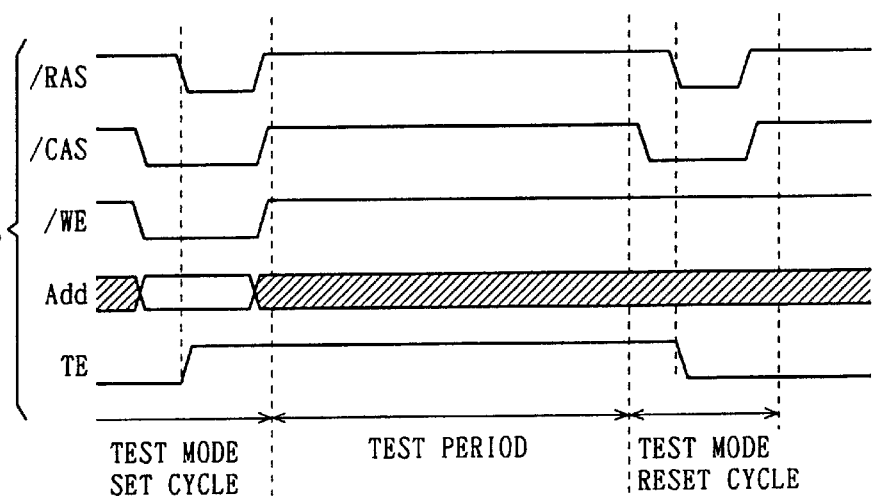
FIG. 5B shows signal waveforms representing the operation of the test mode setting circuit shown in FIG. 5A.

FIG. 5A schematically shows the configuration of a portion from which test mode designating signal is generated. Referring to FIG. 5, a test mode setting circuit 3 receives external control signals, namely a row address strobe signal /RAS, a column address strobe signal /CAS, a write enable signal /WE and a specific address signal bit Add, and activates/deactivates the test mode designating signal TE when these signals are set to a predetermined combination of states. Now, the operation of the test mode setting circuit 3 will be described with reference to FIG. 5B.

To enter a test mode, a test mode set cycle is first effected, and after the setting of the test mode, an actual test, or the monitoring of reference voltage Vref from an outside is conducted. In this test mode set cycle, column address strobe signal /CAS and write enable signal /WE are set to an L level and address signal bit Add is set to a specific state before a rising of row address strobe signal /RAS. This condition is known as a "WCBR+address key" condition. Then, in response to the falling of row address strobe signal /RAS, test mode designating signal TE is brought to an active state. After the setting of the test mode is completed, the test is actually conducted.

To end the test, a test mode reset cycle is effected. In this test mode reset cycle, column address strobe signal /CAS falls at a timing earlier than the falling of row address strobe signal /RAS, while write enable signal /WE remains at an H level. This condition is known as a "CBR condition", and when this CBR condition is satisfied, test mode designating signal TE is brought to an inactive state in response to the falling of row address strobe signal /RAS. Circuits for detecting these WCBR+address key condition and CBR condition are well known in the memory art, and conventional circuits can be utilized. In addition, a "super Vcc condition", in which a specific pin terminal is set to a voltage level still higher than a normally applied voltage level, may be utilized together with the above described conditions, for setting the test mode.

Third Embodiment

Figure 6:
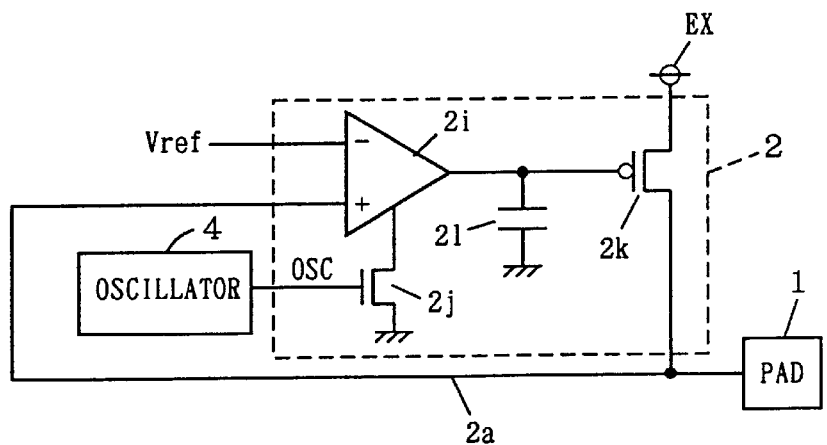
FIG. 6 is a diagram schematically showing the configuration of a main portion of a semiconductor integrated circuit device according to a third embodiment of the present invention.

The configuration of a main portion of a semiconductor memory device according to a third embodiment of the present invention is shown in FIG. 6. In particular, FIG. 6 illustrates a driving circuit 2 provided between the output of a reference voltage generating circuit and a pad 1. Referring to FIG. 6, the driving circuit 2 includes a differential amplifying circuit 2i for differentially amplifying the reference voltage Vref from the reference voltage generating circuit (not shown) and the voltage on a signal line 2a electrically connected to the pad 1, a drive transistor 2k formed of a p channel MOS transistor, for supplying current from an external power supply node EX to signal line 2a according to the output signal of differential amplifying circuit 2i, a current source transistor 2j for turning on intermittently to activate differential amplifying circuit 2i in response to an oscillating signal OSC from an oscillator 4, and a capacitance element 2l for stabilizing the gate potential of drive transistor 2k.

Oscillator 4 is formed of a ring oscillator including, for example, odd number of stages of inverters, and its current driving capability is made sufficiently small. Therefore, differential amplifying circuit 2i in this embodiment consumes much less current than in the structure that the circuit always remains at an active state. According to the oscillating signal OSC from the oscillator 4, current source transistor 2j is selectively turned on to activate differential amplifying circuit 2i. Provided at the output of differential amplifying circuit 2i is a stabilizing capacitance element 2l for stabilizing a gate potential for drive transistor 2k when differential amplifying circuit 2i is in an inactive state. Because pad 1 is not connected to an external lead terminal after packaging, the intermittent operation of driving circuit 2 will exert no adverse effect on the operation of the semiconductor memory device in its practical use.

Specifically, by activating driving circuit 2 intermittently using oscillator 4 as illustrated in FIG. 6, it becomes easier to enter a test operation, without need to set a test mode with the test mode setting circuit 3 as shown in FIG. 5. In other words, there is no need to provide such a test mode setting circuit solely for setting a test mode for monitoring the reference voltage Vref. Oscillator 4 is made to consume sufficiently small amount of current, and occupies a sufficiently small area, so that the area occupied by this configuration can be made smaller than in the case of the configuration containing a test mode setting circuit. A voltage substantially at the same level as reference voltage Vref is transmitted to pad 1 through drive transistor 2k. As there is no need to set a dedicated test mode, it becomes possible to conduct a plurality of tests simultaneously. For example, it is possible to test, by setting another test mode additionally, how the reference voltage Vref is affected during the operation of an internal circuit at the same time.

As described above, according to the third embodiment of the present invention, the driving circuit for generating with a relatively large current driving capability a voltage having substantially the same level as the reference voltage from the reference voltage generating circuit, is activated intermittently without employment of a dedicated test mode setting circuit, and therefore the circuit area can be reduced and a test on the reference voltage can easily be conducted. In addition, the differential amplifying circuit need not be always active, and therefore, the current consumption in the differential amplifying circuit can also be reduced.

Fourth Embodiment

Figure 7:
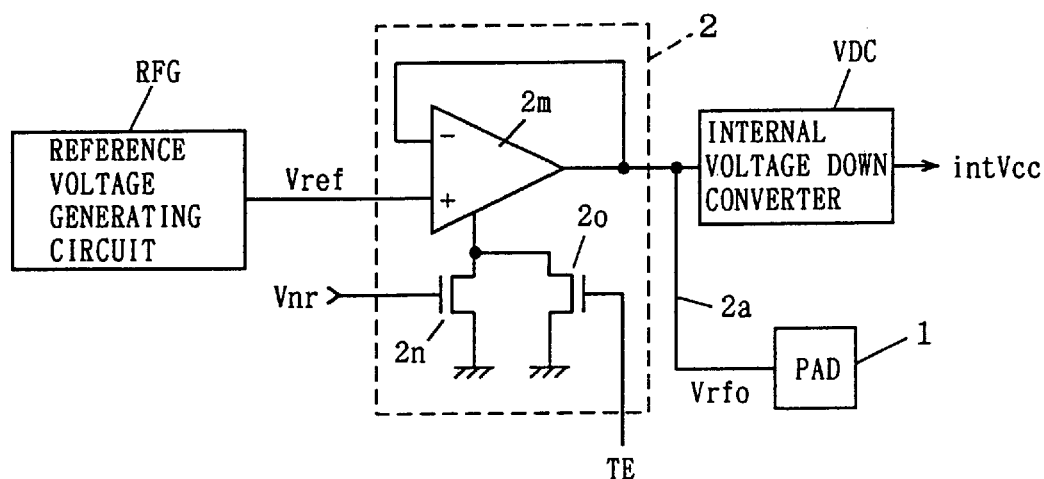
FIG. 7 is a diagram schematically showing the configuration of a main portion of a semiconductor integrated circuit device according to a fourth embodiment of the present invention.

FIG. 7 is a diagram schematically showing the configuration of a main portion of a semiconductor memory device according to the fourth embodiment of the present invention. Referring to FIG. 7, a driving circuit 2 is provided between a reference voltage generating circuit RFG and an internal voltage down converter VDC. The driving circuit 2 receives a reference voltage Vref from reference voltage generating circuit RFG, generates a voltage substantially at the same voltage level as the reference voltage Vref, and provides it to internal voltage down converter VDC as well as to pad 1 through a signal line 2a.

Driving circuit 2 includes a voltage follower type differential amplifying circuit 2m, a current source transistor 2n formed of an n channel MOS transistor having a gate receiving a constant voltage Vnr and functioning as a current source for differential amplifying circuit 2m, and a testing current source transistor 2o formed of an n channel MOS transistor provided in parallel with current source transistor 2n and having a gate receiving a test mode designating signal TE.

In a normal operating mode where test mode designating signal TE is inactive, the operating current for the voltage follower type differential amplifying circuit 2m is determined by the current driven by current source transistor 2n. In this normal operating mode (i.e. when test mode designating signal TE is inactive), driving circuit 2 is not required of a large current supplying capability, and thus the current amount supplied by current source transistor 2n is made sufficiently small (by decreasing the voltage level of constant voltage Vnr, or by making small the ratio of gate width to gate length of current source transistor 2n). Accordingly, the current dissipation by driving circuit 2 in the normal operation is reduced adequately.

On the other hand, in a test mode, test mode designating signal TE is activated and testing current source transistor 2o is turned on. Hence, the operating current of differential amplifying circuit 2m is determined by the current supplied from both current source transistors 2n and 2o and increases in the test mode. Thus, an output voltage Vrfo can be generated with a large current driving capability and transmitted to pad 1. Accordingly, it becomes possible to measure the voltage level of output voltage Vrfo, and therefore that of reference voltage Vref, through pad 1. While pad 1 is connected to the output of driving circuit 2 via a signal line 2a, the signal line 2a is electrically isolated from reference voltage generating circuit RFG because of the presence of driving circuit 2, and therefore, noise on signal line 2a will not exert any adverse effects on reference voltage Vref generated by reference voltage generating circuit RFG. Accordingly, an internal power supply voltage intVcc at a voltage level defined by reference voltage Vref from internal voltage down converter VDC can be generated with accuracy in a normal operation. In addition, driving circuit 2 has a voltage follower type differential amplifying circuit 2m, which in turn has a larger current supplying capability than reference voltage generating circuit RFG, and therefore is capable of stably transmitting reference voltage Vref at a constant voltage level to internal voltage down converter VDC without being affected by noise on signal line 2a in the normal operating mode.

Modification

Figure 8:
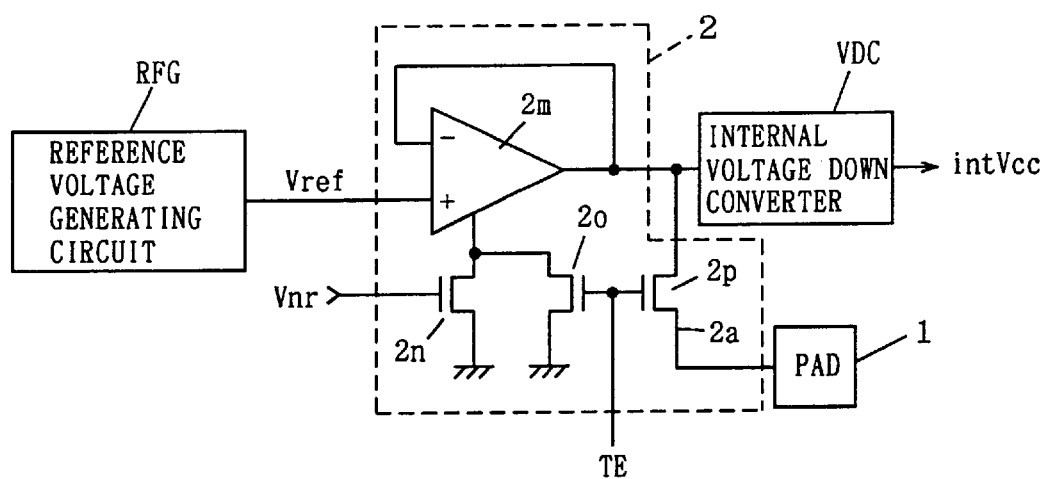
FIG. 8 is a diagram schematically showing the configuration of a modification of the fourth embodiment of the present invention.

FIG. 8 shows the configuration of a modification of the fourth embodiment of the present invention. In this configuration shown in FIG. 8, a switching transistor 2p is provided on signal line 2a connecting the output of driving circuit 2 and pad 1. The transistor 2p is formed of an n channel MOS transistor having a gate receiving test mode designating signal TE. Other portions are the same as those in the configuration shown in FIG. 7, and corresponding parts are denoted by same reference numerals.

In the configuration shown in FIG. 8, the output of driving circuit 2 is electrically connected to pad 1 only when test mode designating signal TE is activated. In a normal operating mode, switching transistor 2p is in an off state, and the output of driving circuit 2 and pad 1 are electrically isolated. Accordingly, even if noise occurs at pad 1 in the normal operating mode, it is ensured that any adverse effect of the noise is prevented from being transmitted on the output of driving circuit 2, and thus a stable transmission of the reference voltage at a constant voltage level to internal voltage down converter VDC is accomplished.

Fifth Embodiment

Figure 9:
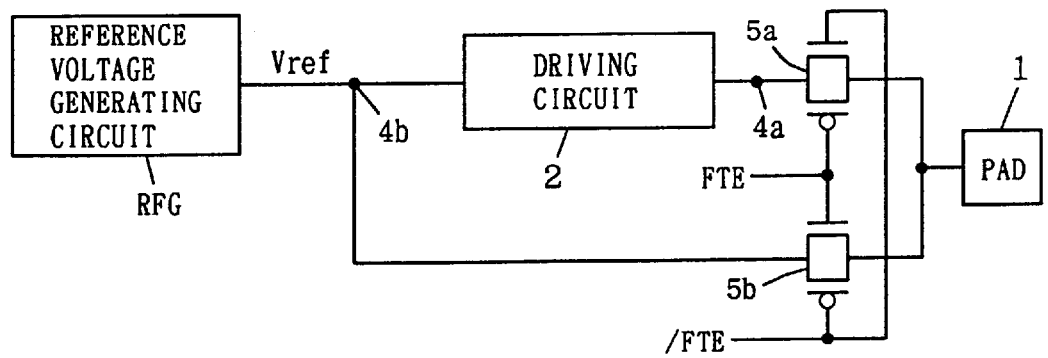
FIG. 9 is a diagram schematically showing the configuration of a main portion of a semiconductor integrated circuit device according to a fifth embodiment of the present invention.

FIG. 9 is a diagram schematically showing the configuration of a main portion of a semiconductor memory device according to the fifth embodiment of the present invention. In the configuration shown in FIG. 9, a transmission gate 5a is provided between a pad 1 and an output node 4a of the driving circuit 2, for transmitting the reference voltage Vref from reference voltage generating circuit RFG to pad 1. Transmission gate 5a is made selectively conductive in response to force test enable signals FTE and /FTE. In addition, a CMOS transmission gate 5b is provided between pad 1 and an output node 4b of reference voltage generating circuit RFG. The transmission gate 5b becomes conductive when force test enable signals FTE and /FTE are activated. CMOS transmission gates 5a and 5b are rendered conductive/nonconductive complementarily. The force test mode is a mode for testing an operating margin and the like of an internal circuit by externally forcing the internal voltage to a predetermined voltage level. When force test enable signals FTE and /FTE are activated, CMOS transmission gate 5b is made conductive, and pad 1 is electrically connected to output node 4b of reference voltage generating circuit RFG. As a result, it becomes possible to change reference voltage Vref through pad 1, and accordingly, to adjust the voltage level of internal power supply voltage intVcc and to measure the operating margin of the internal circuit for the internal power supply voltage intVcc (to see if the operating speed (access time) is satisfying a prescribed value (specification value) and if data is being written/read accurately).

In the operating modes other than the force test mode, CMOS transmission gate 5b is in an off state and CMOS transmission gate 5a is turned on, and thus output node 4a of driving circuit 2 is electrically connected to pad 1. Therefore, in this state, the voltage output from driving circuit 2 can be externally monitored through pad 1. For this driving circuit 2, either configuration shown in FIG. 1, 3 or 6 may be used.

Modification

Figure 10:
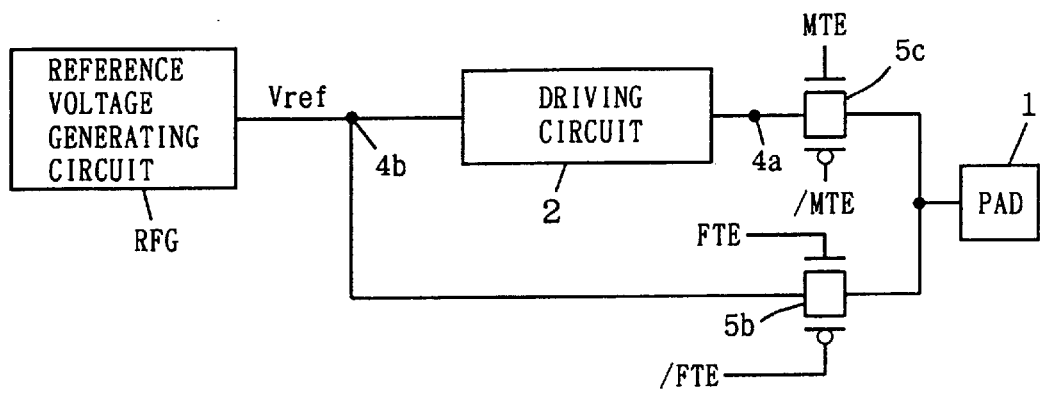
FIG. 10 is a diagram schematically showing the configuration of a modification of the fifth embodiment of the present invention.

FIG. 10 shows the configuration of a modification of the fifth embodiment of the present invention. In the configuration shown in FIG. 10, a CMOS transmission gate 5c is provided between output node 4a of driving circuit 2 and pad 1, and is rendered conductive when monitoring test enable signals MTE and /MTE are activated. Other portions are the same as those in the configuration shown in FIG. 9, and corresponding parts are denoted by same reference numerals.

In the configuration shown in FIG. 10, output node 4a of driving circuit 2 is electrically connected to pad 1 in external monitoring of the voltage level of reference voltage Vref from reference voltage generating circuit RFG. In this state, CMOS transmission gate 5b is in an off state. Meanwhile, in the force test mode, force test enable signals FTE and /FTE are activated, and accordingly, CMOS transmission gate 5b turns on, and CMOS transmission gate 5c turns off.

By electrically connecting pad 1 selectively to output node 4a of driving circuit 2 or output node 4b of reference voltage generating circuit RFG in response to the test modes, with the parasitic capacitance associated with pad 1 made minimum, it is possible to execute a test on reference voltage Vref.

In a mode other than the force test mode or monitoring test mode, CMOS transmission gates 5c and 5b are both in an off state and pad 1 is electrically isolated from both output node 4a of driving circuit 2 and output node 4b of reference voltage generating circuit RFG. Accordingly, noise on pad 1 can be prevented from affecting reference voltage Vref generated by reference voltage generating circuit RFG.

Note that it is possible to set force test enable signal FTE and monitoring test enable signal MTE independently by changing the address keys in the configuration shown in FIG. 5A described above. Driving circuit 2 may be any one of the arrangements of FIGS. 1, 3 and 6.

Sixth Embodiment

Figure 11:
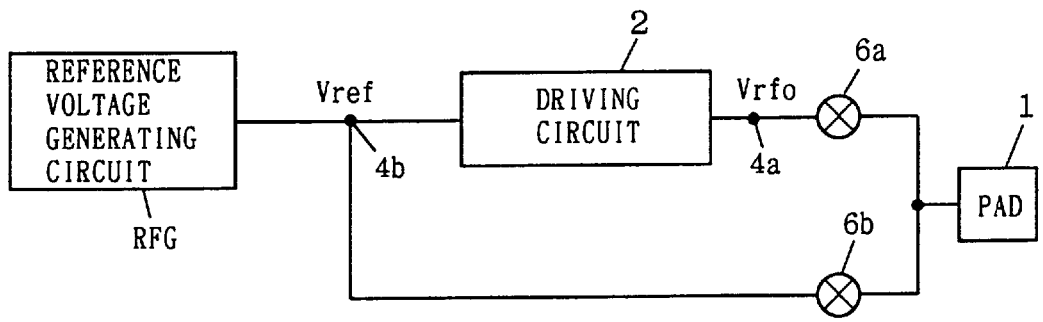
FIG. 11 is a diagram schematically showing the configuration of a main portion of a semiconductor integrated circuit device according to a sixth embodiment of the present invention.

FIG. 11 is a diagram showing the configuration of a main portion of a semiconductor memory device according to a sixth embodiment of the present invention. In the configuration shown in FIG. 11, a fusible link element 6a is provided between output node 4a of driving circuit 2 and pad 1, and another fusible link element 6b is provided between output node 4b of reference voltage generating circuit RFG and pad 1. The configuration illustrated in FIG. 11 is an equivalent to the configurations shown in FIGS. 9 and 10, with the fusible link elements replacing the CMOS transmission gates 5a, 5b and 5c.

The test on reference voltage Vref generated by reference voltage generating circuit RFG is effected at a wafer level, and more specifically, the monitoring test and force test are conducted at the wafer level. In the test operation, output node 4a of driving circuit 2 is electrically connected to output node 4b of reference voltage generating circuit RFG, or an input node of driving circuit 2, through link elements 6a and 6b. However, driving circuit 2 generates a voltage at the same voltage level as reference voltage Vref generated by reference voltage generating circuit RFG.

Therefore, in the mode where the output voltage of driving circuit 2 is externally monitored through pad 1, output voltage Vrfo of driving circuit 2 and reference voltage Vref generated by reference voltage generating circuit RFG have the same voltage level, and thus no current flows from driving circuit 2 to reference voltage generating circuit RFG through link elements 6a and 6b, so that no variation occurs in the voltage level of reference voltage Vref generated by reference voltage generating circuit RFG.

Also in this monitoring test mode, if noise occurs at pad 1, it will be absorbed by the current supplied from driving circuit 2, so that any adverse effect of the noise of pad 1 on reference voltage Vref generated from reference voltage generating circuit RFG can be prevented.

In the force test mode, the voltage level of output node 4b of reference voltage generating circuit RFG is set to a predetermined voltage level through pad 1. At this time, driving circuit 2 may be driven to an inactive state. However, even if the driving circuit is in an operating state, no problem will occur because output voltage Vrfo of the driving circuit 2 will change according to the voltage level applied from the outside through pad 1. It is thus possible to set reference voltage Vref output from reference voltage generating circuit RFG to a predetermined voltage level accurately. Also, in the force test mode, the external tester has a current driving capability sufficiently larger than the output current driving capability of driving circuit 2, so that reference voltage Vref output from reference voltage generating circuit RFG can be set to a desired voltage level with accuracy regardless of the level of the output voltage of driving circuit 2.

After completing both monitoring test mode and force test mode, link elements 6a and 6b are fused off to electrically isolate pad 1 from reference voltage generating circuit RFG and driving circuit 2. Accordingly, noise from pad 1 in a normal operation mode can be prevented from affecting reference voltage generating circuit RFG.

The area occupied by link elements 6a and 6b is sufficiently small, whereby circuit area can be reduced. Further, because only link elements 6a and 6b are used and there is no need to generate any control signals for controlling conduction/nonconduction thereof, the circuit configuration for permitting a test operation can be simplified.

In a semiconductor memory device, in order to repair defective memory cells for example, fuse elements (link elements) are fused off upon programming of the addresses of the defective memory cells in the process for replacing them with redundant memory cells. The link elements 6a and 6b in this embodiment can be fused off in the same fusing process with the repairing process, so that no additional process is required for fusing off the link elements 6a and 6b.

As described above, according to the sixth-embodiment of the present invention, fusible link elements are disposed respectively between the output of the driving circuit and the pad and between the output node of the reference voltage generating circuit and the pad. Hence, it is possible to conduct an accurate test on the reference voltage without increasing the circuit area.

Seventh Embodiment

Figure 12:
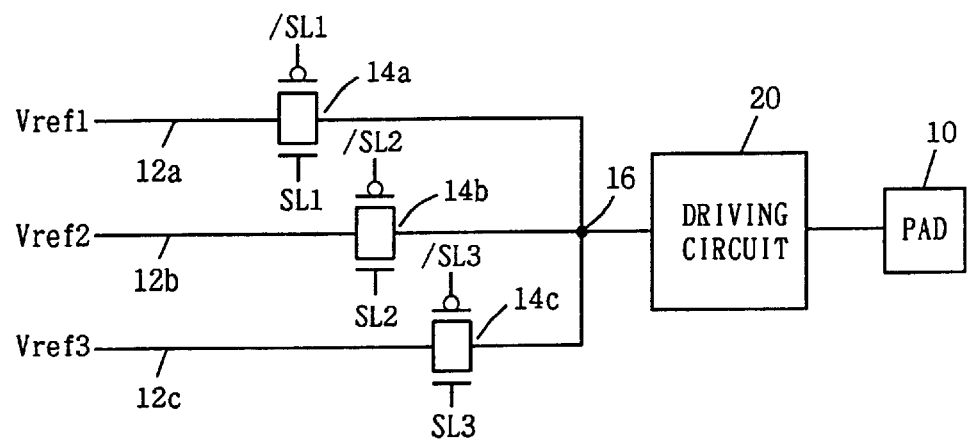
FIG. 12 is a diagram schematically showing the configuration of a main portion of a semiconductor integrated circuit device according to a seventh embodiment of the present invention.

FIG. 12 shows the configuration of a main portion of a semiconductor memory device according to a seventh embodiment of the present invention. In the configuration shown in FIG. 12, a plurality of reference voltages (three reference voltages in the case of FIG. 12), Vref1, Vref2 and Vref3 are tested using one pad 10.

Referring to FIG. 12, there are provided a CMOS transmission gate 14a made brought conductive when select signals SL1 and /SL1 are activated, to transmit reference voltage Vref1 transmitted on a reference voltage transmission line 12a to a node 16, a CMOS transmission gate 14b made conductive when select signals SL2 and /SL2 are activated, to transmit reference voltage Vref2 on a reference voltage transmission line 12b to node 16, and a CMOS transmission gate 14c made conductive when select signals SL3 and /SL3 are activated, to transmit reference voltage Vref3 transmitted on a reference voltage transmission line 12c to node 16. These CMOS transmission gates 14a, 14b and 14c are made conductive alternatively according to the select signals SL1, SL2 and SL3 in a test mode (i.e. monitoring test mode).

A driving circuit 20 is provided between node 16 and pad 10, and generates a voltage substantially at the same voltage level as the reference voltage transmitted on node 16 and transmits it to pad 10. The configuration of the driving circuit 20 may be any of the configurations of drive circuit 2 FIGS. 1, 3, and 6.

In the configuration shown in FIG. 12, the plurality of reference voltages Vref1, Vref2 and Vref3 are generated from separate reference voltage generating circuits. These reference voltages include, for example, the reference voltage used for generating an internal power supply voltage applied to a peripheral circuit such as a row decoder, the reference voltage used for generating an internal power supply voltage for charging/discharging the bit lines of the memory cell array through the sense amplifier circuit, and the reference voltage used for internally generating an internal power supply voltage to be used as one operational power supply voltage for the circuit generating a word line driving voltage Vpp and a substrate bias voltage Vbb.

The plurality of reference voltages Vref1–Vref3 are selectively transmitted to node 16 according to select signals SL1–SL3 in a monitoring test mode. Driving circuit 20 generates a voltage substantially at the same level as that of the reference voltage applied to node 16, and transmits thus generated voltage to pad 10. Therefore, a plurality of reference voltages can be monitored using one pad, so that the number of pads and accordingly the chip area can be reduced.

Figure 13A:
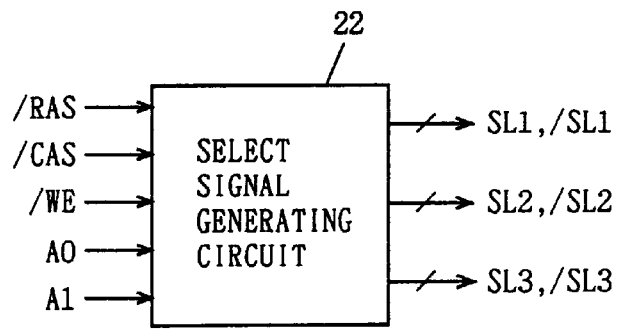
FIG. 13A schematically shows the configuration of the select signal generating portion shown in FIG. 12.

FIG. 13A shows the configuration of a select signal generating portion. Referring to FIG. 13A, the select signal generating circuit 22 drives the sets of select signals SL1 and /SL1, SL2 and /SL2, and SL3 and /SL3 to an active state when each of a row address strobe signal /RAS, a column address strobe signal /CAS, a write enable signal /WE and address signal bits A0 and A1 is set to a predetermined state. When signals /RAS, /CAS and /WE are satisfying the WCBR condition, select signal generating circuit 22 drives the sets of select signals into an active state, one set at a time, according to the combination of address signal bits A0 and A1.

Figure 13B:
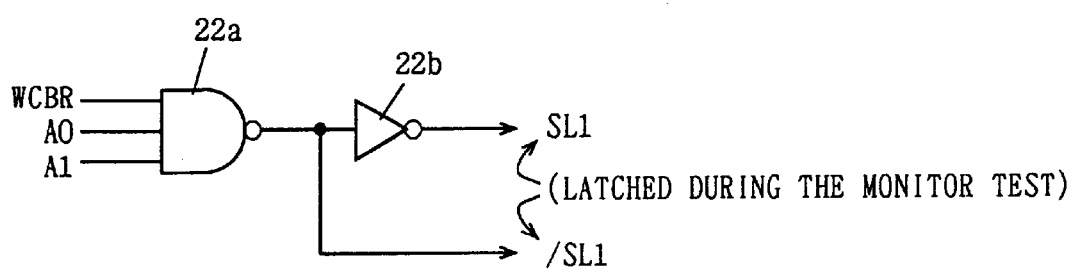
FIG. 13B shows an example of the internal configuration of the select signal generating circuit shown in FIG. 13A.

FIG. 13B shows an example of the configuration of a circuit for generating select signals SL1 and /SL1 included in select signal generating circuit 22. In FIG. 13B, the unit selecting signal generating circuit includes a NAND circuit 22a receiving a WCBR detecting signal WCBR made conductive when the WCBR condition is satisfied and address signal bits A0 and A1, and an inverter circuit 22b receiving the output signal of NAND circuit 22a. Select signal /SL1 is output from NAND circuit 22a, and select signal SL1 is output from inverter circuit 22b.

When WCBR detecting signal WCBR is at an H level and address signal bits A0 and A1 are both at an H level, select signals SL1 and /SL1 are driven to an active state. In FIG. 13B, when the monitoring test mode is designated, select signals SL1 and /SL1 are latched at a latch circuit portion, not shown. The other sets of select signals SL2 and /SL2, and SL3 and /SL3 are respectively brought to an active state according to the predetermined combination of the high and low levels of address signal bits A0 and A1.

By using the select signal generating circuit as shown in FIGS. 13A and 13B, select signals can be easily generated for the reference voltages to be monitored in the monitoring test mode.

Modification

Figure 14:
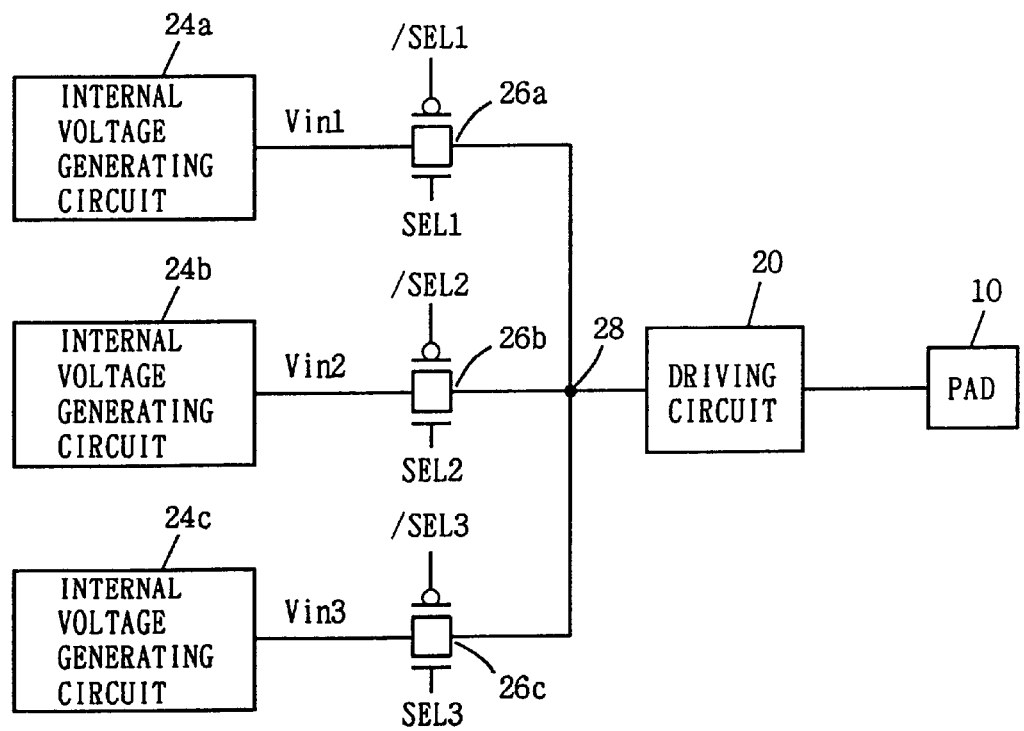
FIG. 14 is a diagram schematically showing the configuration of a modification of the seventh embodiment of the present invention.

FIG. 14 shows the configuration of a modification of the seventh embodiment of the present invention. In FIG. 14, internal voltages Vin1, Vin2 and Vin3 generated by a plurality of internal voltage generating circuits 24a, 24b and 24c are externally monitored via one pad 10.

Referring to FIG. 14, there are provided a CMOS transmission gate 26a made conductive when select signals SEL1 and /SEL1 are activated, to transmit internal voltage Vin1 generated by internal voltage generating circuit 24a to a node 28, a CMOS transmission gate 26b made conductive when select signals SEL2 and /SEL2 are activated, to transmit internal voltage Vin2 generated by internal voltage generating circuit 24b to node 28, and a CMOS transmission gate 26c made conductive when select signals SEL3 and /SEL3 are activated, to transmit internal voltage Vin3 generated by internal voltage generating circuit 24c to node 28. For the internal voltage transmitted to node 28, driving circuit 20 converts the impedance and changes its output current driving amount, and the resulting voltage is transmitted to pad 10. The voltage thus transmitted to pad 10 remains at the same voltage level as the voltage transmitted on internal node 28.

Internal voltage generating circuits 24a–24c may include those circuits generally used in a semiconductor memory device, such as a circuit for generating a boosted voltage Vpp to be transmitted to a selected word line, a bit line precharge voltage generating circuit for generating a bit line precharge voltage VBL used to precharge a bit line in the standby cycle, a substrate bias voltage generating circuit for generating a substrate bias voltage VBB to be applied to a substrate region, a cell plate voltage generating circuit for generating a cell plate voltage VCP to be applied to one electrode (cell plate) of a memory cell capacitor (in the case of a dynamic random access memory), and an internal power supply voltage generating circuit for generating an internal power supply voltage intVcc. Through the monitoring of these internal voltages from outside, it is possible to see if the semiconductor memory device has been operating correctly and generating a voltage at a desired voltage level.

The plurality of internal voltage generating circuits 24a–24c are commonly provided to one pad 10, so that required internal voltage level can be externally monitored without increasing the number of pads.

As discussed above, according to the seventh embodiment of the present invention, since a single pad is provided commonly for a plurality of internal voltage generating circuits and the output voltages from these internal voltage generating circuits are selectively transmitted to the pad in a test mode, external monitoring of a required internal voltage can easily be accomplished without increasing the number of pads.

Eighth Embodiment

Figure 15:
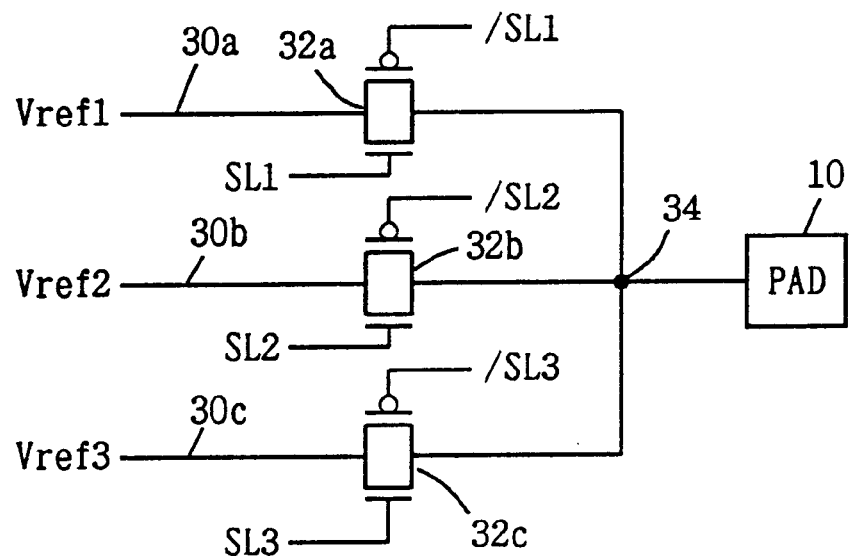
FIG. 15 is a diagram schematically showing the configuration of a main portion of a semiconductor integrated circuit device according to an eighth embodiment of the present invention.

FIG. 15 is a diagram showing the configuration of a main portion of a semiconductor memory device according to an eighth embodiment of the present invention. Referring to FIG. 15, the voltage levels of a plurality of reference voltages (three different reference voltages in the case of FIG. 15), Vref1, Vref2 and Vref3 can be externally changed through one pad 10. Specifically, in the configuration shown in FIG. 15, there are provided a CMOS transmission gate 32a made conductive when select signals SL1 and /SL1 are activated, to electrically connect a signal line 30a to a node 34, a CMOS transmission gate 32b made conductive when select signals SL2 and /SL2 are activated, to electrically connect a signal line 30b to internal node 34, and a CMOS transmission gate 32c made conductive when select signals SL3 and /SL3 are activated, to electrically connect a signal line 30c to internal node 34.

Node 34 is connected to pad 10. Signal lines 30a, 30b, and 30c are respectively connected to the outputs of reference voltage generating circuits generating reference voltages Vref1, Vref2 and Vref3 respectively. Select signals SL1–SL3 and /SL1–/SL3 are selectively driven to an active state in a force test mode. Thus in the force test mode, by selectively driving the sets of select signals SL1 and /SL1, SL2 and /SL2, and SL3 and /SL3 to an active state, it is made possible to force the voltage levels of the plurality of reference voltages Vref1–Vref3 to a desired voltage level by using one pad 10. Accordingly, the force test mode on a plurality of reference voltages can be easily implemented without increasing the number of pads.

Note that select signals SL1–SL3 can be generated by using a configuration similar to the select signal generating circuit shown in FIG. 13A.

Modification

Figure 16:
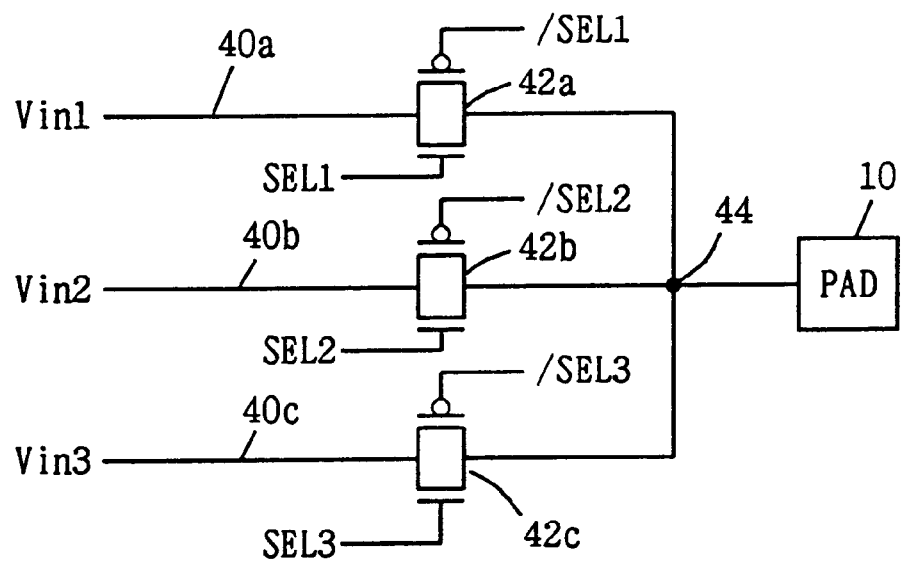
FIG. 16 is a diagram schematically showing the configuration of a modification of the eighth embodiment of the present invention.

FIG. 16 shows the configuration of a modification of the eighth embodiment of the present invention. Referring to FIG. 16, a plurality of internal voltages (three internal voltages in the case of FIG. 16) Vin1, Vin2 and Vin3 are forced from outside through pad 10 to a desired voltage level. That is, a force test on a plurality of internal voltages can be conducted through one pad 10.

Referring to FIG. 16, in order to execute the force test, there are provided a CMOS transmission gate 42a made conductive when select signals SEL1 and /SEL1 are activated, to electrically connect a signal line 40a to a node 44, a CMOS transmission gate 42b made conductive when select signals SEL2 and /SEL2 are activated, to electrically connect an internal signal line 40b to node 44, and a CMOS transmission gate 42c made conductive when select signals SEL3 and /SEL3 are activated, to electrically connect a signal line 40c to node 44. Node 44 is connected to pad 10.

Signal lines 40a, 40b and 40c are electrically connected to the respective outputs of internal voltage generating circuits generating internal voltages Vin1, Vin2 and Vin3 respectively. The sets of select signals SEL1 and /SEL1, SEL2 and /SEL2, and SEL3 and /SEL3 are selectively brought to an active state in the force test mode. Therefore, one signal line can be made electrically connected to pad 10 according to the select signals SEL1–SEL3 and /SEL1–/SEL3, whereby a force test can be conducted on a plurality of internal voltages using one pad.

According to the eighth embodiment of the present invention, one pad is commonly provided for a plurality of internal voltage transmission lines and these plurality of internal voltage transmission lines are made electrically connected to the pad selectively and alternatively. Consequently, a force test for a plurality of internal voltages can be conducted using a single pad and thus the area occupied by pads can be reduced.

Ninth Embodiment

Figure 17:
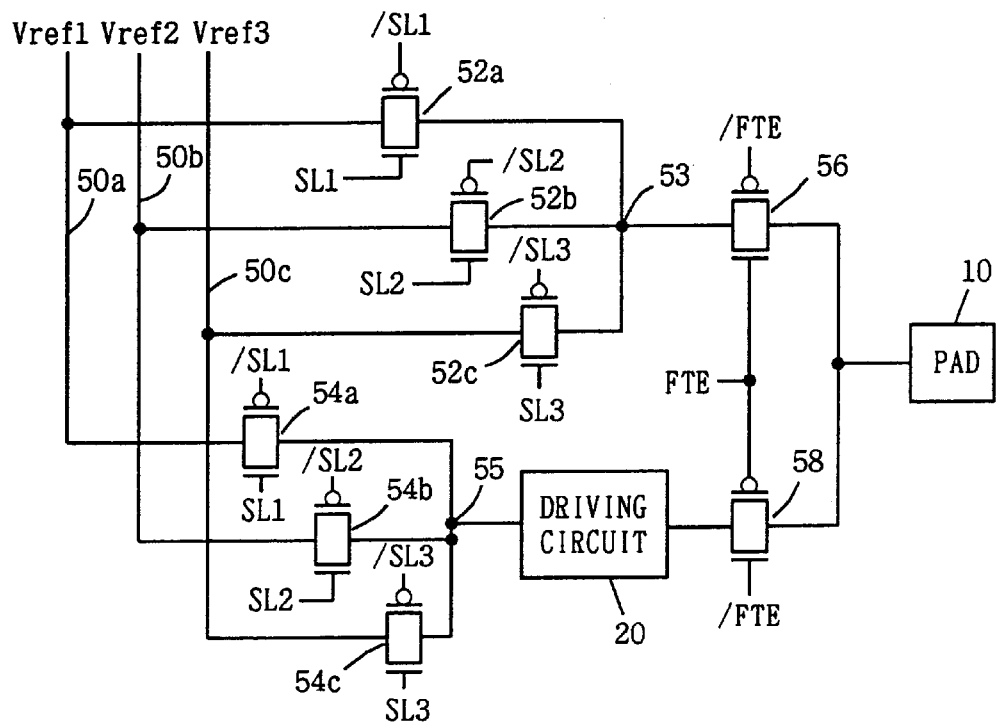
FIG. 17 is a diagram schematically showing the configuration of a main portion of a semiconductor integrated circuit device according to a ninth embodiment of the present invention.

FIG. 17 is a diagram showing the configuration of a main portion of a semiconductor memory device according to a ninth embodiment of the present invention. In the configuration shown in FIG. 17, both monitoring test and force test modes can be implemented for a plurality of reference voltages (three different voltages in the case of FIG. 17) Vref1, Vref2 and Vref3.

Referring to FIG. 17, for the implementation of the force test mode, there are provided a CMOS transmission gate 52a made conductive when select signals SL1 and /SL1 are activated, to electrically connect a reference voltage transmission line 50a to a node 53, a CMOS transmission gate 52b made conductive when select signals SL2 and /SL2 are activated, to electrically connect a reference voltage transmission line 50b to node 53, and a CMOS transmission gate 52c made conductive when select signals SL3 and /SL3 are activated, to electrically connect a reference voltage transmission line 50c to node 53. Reference voltage transmission lines 50a, 50b and 50c are electrically connected to the respective outputs of the reference voltage generating circuits generating reference voltages Vref1, Vref2 and Vref3 respectively.

For the implementation of the monitoring test mode, there are provided a CMOS transmission gate 54a made conductive when select signals SL1 and /SL1 are activated, to electrically connect reference voltage transmission line 50a to a node 55, a CMOS transmission gate 54b made conductive when select signals SL2 and /SL2 are activated, to electrically connect reference voltage transmission line 50b to node 55, and a CMOS transmission gate 54c activated when select signals SL3 and /SL3 are activated, to electrically connect reference voltage transmission line 50c to node 55. Node 55 is connected to the input of driving circuit 20.

Furthermore, a CMOS transmission gate 56 is provided between node 53 and pad 10, and is made conductive when force test enable signals FTE and /FTE are activated, to electrically connect node 53 to pad 10. Also, a CMOS transmission gate 58 is provided between the output of driving circuit 20 and pad 10, and is made conductive when force test enable signals FTE and /FTE are inactivated, to electrically connect the output of driving circuit 20 to pad 10.

The configuration shown in FIG. 17 is essentially a combination of the above described seventh and eighth embodiments. In the force test mode, CMOS transmission gate 56 becomes conductive and either one of reference voltage transmission lines 50a–50c is electrically connected to pad 10. Since select signals SL (SL1–SL3) and /SL (SL1–SL3) are commonly used in both the force test mode and the monitoring test mode, the same reference voltage transmission line is electrically connected to both pad 10 and the input node 55 of driving circuit 20. However, the output voltage of driving circuit 20 will exert no influence in the force test mode, so that the selected reference voltage level can be externally forced to a desired voltage level.

In the monitoring test mode, CMOS transmission gate 56 is placed in an off state, CMOS transmission gate 58 in an on state, and the output of driving circuit 20 is electrically connected to pad 10. Thus in this case, either one of reference voltages Vref1–Vref3 on reference voltage transmission lines 50a–50c is selected according to a select signal and transmitted to pad 10 via driving circuit 20 and CMOS transmission gate 58 to be externally monitored. In this operation, either one of CMOS transmission gates 52a–52c is turned on. However, if the load (parasitic capacitance) on the path for use in executing the force test is made sufficiently small, the monitoring test can be reliably conducted, not affected by the path to be used for the force test.

Note that, in the configuration shown in FIG. 17, an alternative configuration may be employed in which the select signals to be applied to CMOS transmission gates 52a–52c will be selectively brought to an active state only in the force test mode, while CMOS transmission gates 54a–54c will be selectively driven to an active state only in the monitoring test mode. This is readily implemented by simply taking the logical product of select signals, SL and /SL, and force test enable signal FTE.

Modification

Figure 18:
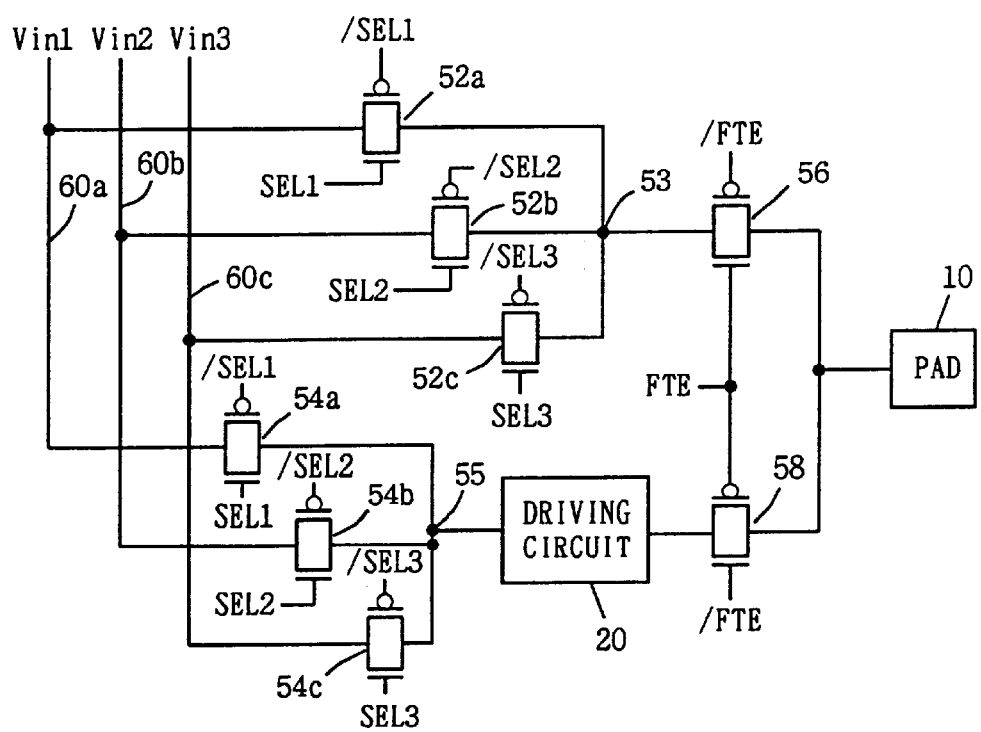
FIG. 18 is a diagram schematically showing the configuration of a modification of the ninth embodiment of the present invention.
Figure 19:
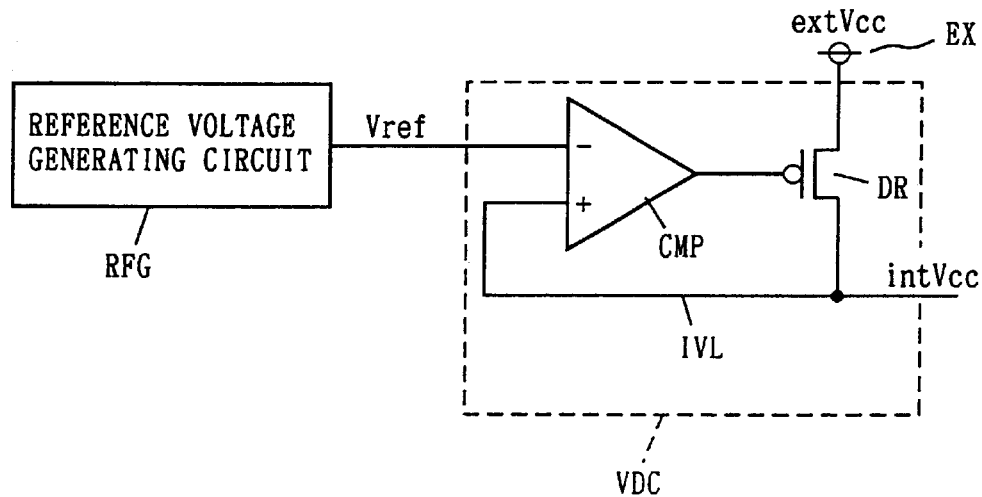
FIG. 19 is a diagram schematically showing the configuration of a conventional internal power supply voltage generating circuit.

FIG. 18 shows the configuration of a modification of the ninth embodiment of the present invention. The configuration shown in FIG. 18 is capable of implementing both the monitoring test mode and the force test mode on internal voltages Vin1, Vin2 and Vin3 being transmitted on signal lines 60a, 60b and 60c. This configuration is identical to that of the ninth embodiment, and in FIG. 18, only select signals on both the path for use in implementing the monitoring test mode and the path for implementing the force test mode are denoted by characters different from those used in the configuration shown in FIG. 17. The CMOS transmission gates are designated by like reference numerals and the detailed description will not be repeated.

By selectively activating select signals SEL1 and /SEL1, SEL2 and /SEL2, and SEL3 and /SEL3, the monitoring test mode or the force test mode can be implemented for the internal voltage designated by the select signals out of internal voltages Vin1, Vin2 and Vin3.

In the configuration shown in FIG. 18, signal lines 60*a*, 60*b* and 60*c* are electrically connected to the respective outputs of internal voltage generating circuits generating internal voltages Vin1, Vin2 and Vin3 respectively.

As described above, according to the ninth embodiment of the present invention, since these plurality of internal voltage transmission lines are made to be electrically connected to the pad according to the select signals or to be connected to the pad electrically via the driving circuit, both monitoring test and force test on these internal voltages are allowed, and it is thus possible to externally monitor a desired internal voltage without increasing the number of pads.

Other Applications

In the foregoing explanation, a semiconductor memory device, and particularly a dynamic type semiconductor memory device, has been described as an example of the semiconductor integrated circuit device. However, the present invention can be applied to any semiconductor integrated circuit device as far as it has a test mode for externally monitoring a plurality of internal voltages.

Figure 20:
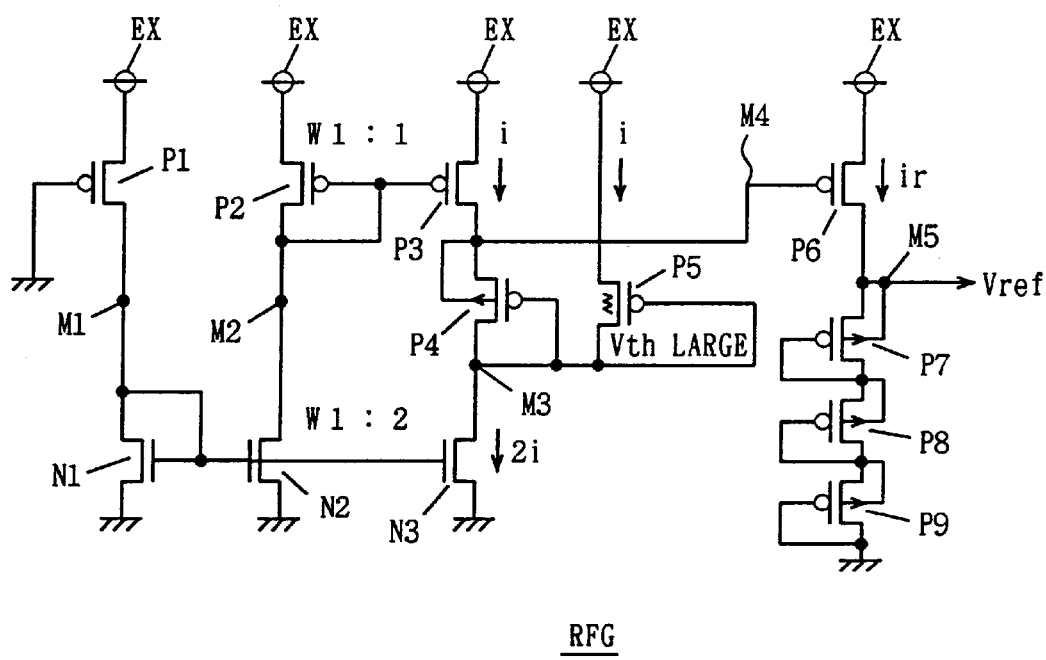
FIG. 20 shows an example of the configuration of the reference voltage generating circuit shown in FIG. 19.
Figure 21:
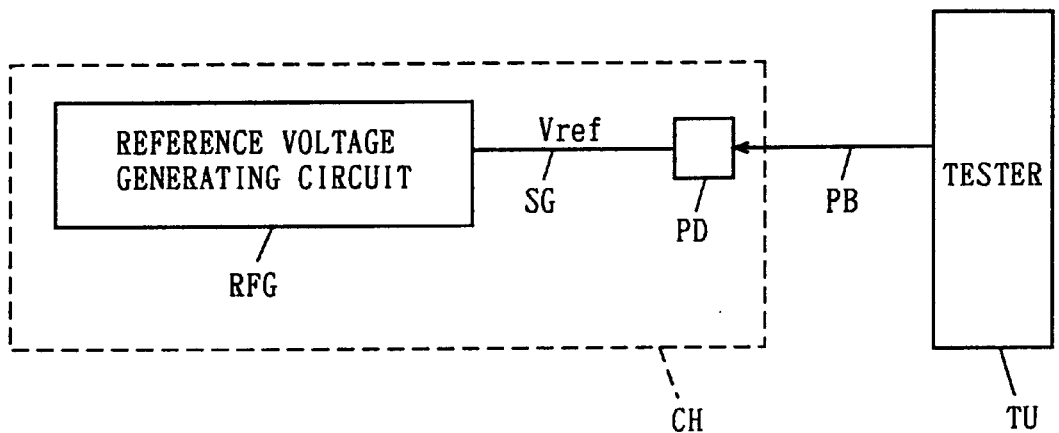
FIG. 21 is a diagram schematically showing an arrangement for a monitoring test for a conventional semiconductor integrated circuit device.
Figure 22:
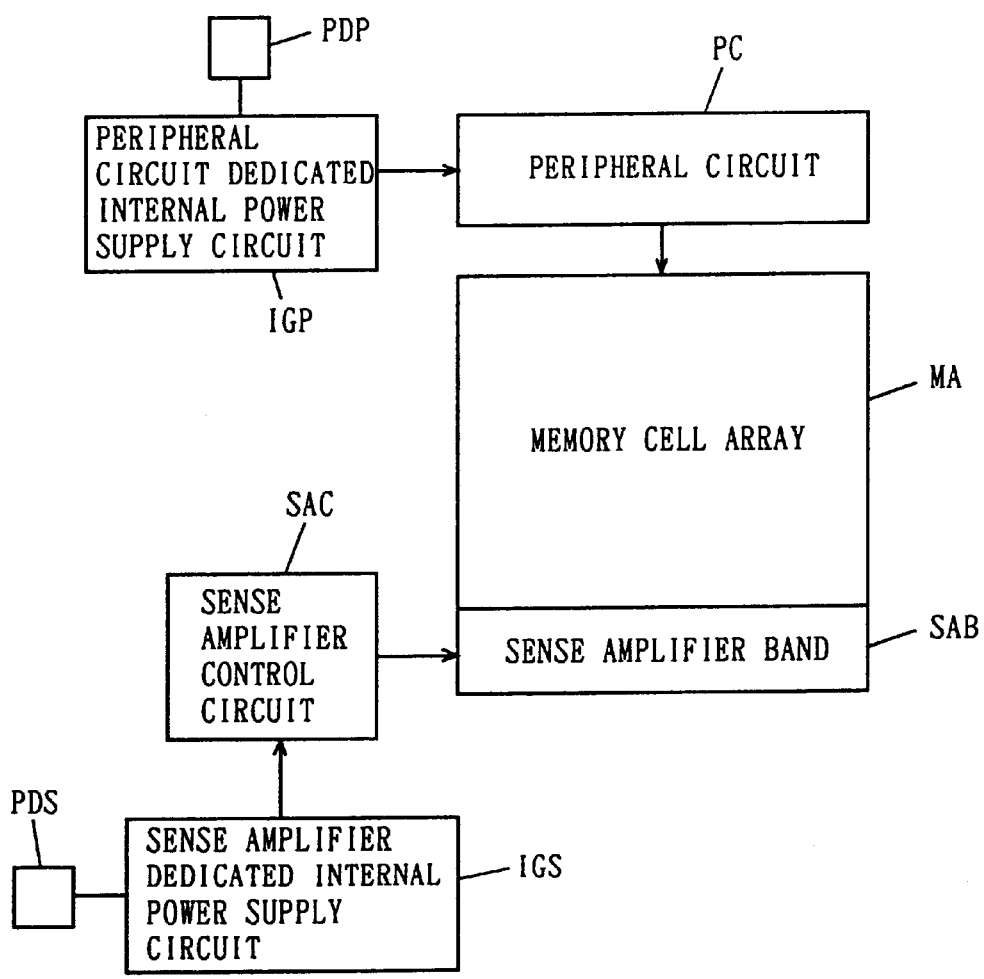
FIG. 22 is a diagram schematically showing the configuration of a main portion of a conventional semiconductor integrated circuit device.

Also, the configuration of the reference voltage generating circuit is not limited to that shown in FIG. 20, and it can be any constant-voltage generating circuit including a constant-current source and a converting element for converting the constant-current from the constant-current source to a voltage.

As discussed above, according to the present invention, since the output of an internal voltage generating circuit with a small current supplying capability can be electrically connected to a pad through a driving circuit having a relatively large current supplying capability and capable of converting the impedance, it is possible to externally monitor the output voltage level of the internal voltage generating circuit having such a small current supplying capability with accuracy.

Furthermore, in the configuration according to the present invention, a pad is provided commonly for a plurality of internal voltages and the common pad is electrically connected to the plurality of internal voltage transmission lines selectively, and therefore it is possible to conduct a test on the plurality of internal voltages using one pad, and accordingly to reduce the chip area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:
   a plurality of voltage transmission lines each having an internal voltage at a predetermined voltage level transmitted thereon;
   a pad electrically connectable to a testing apparatus so as to allow a level of a voltage transmitted thereon to be externally monitored;
   connecting means provided between each of said plurality of voltage transmission lines and an internal node, and responsive to a select signal for electrically coupling a voltage transmission line designated by the select signal to said internal node;
   a driver coupled between said internal node and said pad, and responsive to a test mode designating signal designating a test mode, for driving said pad in accordance with a voltage on said internal node; and
   an internal voltage generator provided separately from said driver, for producing an internal voltage on an internal voltage line, the internal voltage being transmitted through a voltage transmission line in said plurality of voltage transmission lines.

2. The semiconductor integrated circuit device according to claim 1, wherein said select signal is brought to an active state in the test mode to designate either one of said plurality of voltage transmission lines.

3. The semiconductor integrated circuit device according to claim 1, wherein said connecting means includes:
   selection circuitry provided between each of said plurality of voltage transmission lines and said internal node, and responsive to said select signal for electrically connecting a voltage transmission line designated by the select signal to the internal node, and
   said driver generates a voltage substantially at the same level as the voltage on the internal node for transmission to said pad.

4. The semiconductor integrated circuit device according to claim 1, wherein said connecting means further includes selection circuitry coupled between each of said plurality of voltage transmission lines and said pad, and responsive to a second select signal for connecting a corresponding one of said plurality of voltage transmission lines selected by said select signal to said pad, and said second select signal is generated in a second test mode.

5. The semiconductor integrated circuit device according to claim 1, wherein said plurality of voltage transmission lines transmit the internal voltages at predetermined voltage levels different from each other.

6. The semiconductor integrated circuit device according to claim 1, wherein said plurality of voltage transmission lines each transmit a reference voltage at a constant voltage level as said internal voltage.

7. A semiconductor integrated circuit device, comprising:
   a plurality of voltage transmission lines each having an internal voltage at a predetermined voltage level transmitted thereon;
   a pad electrically connectable to a testing apparatus so as to allow a level of a voltage transmitted thereon to be externally monitored;
   connecting means provided between each of said plurality of voltage transmission lines and a first internal node, and responsive to a select signal for electrically coupling a voltage transmission line designated by the select signal to said first internal node, said connecting means including selection circuitry coupled between each of said plurality of voltage transmission lines and said first internal node, and responsive to said select signal for coupling a voltage transmission line selected by said select signal out of said plurality of voltage transmission lines to said first internal node, and a connecting element connected between a second internal node and said pad, and responsive to a second test mode designating signal for connecting said second internal node to said pad; and
   a driver coupled between said first internal node and said second internal node, and responsive to a first test mode designating signal designating a first test mode, for driving said pad through said connecting element in accordance with a voltage on said first internal node.

8. A semiconductor integrated circuit device, comprising:
   a plurality of voltage transmission lines each having an internal voltage at a predetermined voltage level transmitted thereon;
   a pad electrically connectable to a testing apparatus so as to allow a level of a voltage transmitted thereon to be externally monitored;

connecting means provided between each of said plurality of voltage transmission lines and a first internal node, and responsive to a select signal for electrically coupling a voltage transmission line designated by the select signal to said first internal node;

a driver electrically coupled between said first internal node and said pad, and responsive to a test mode designating signal designating a test mode, for driving said pad in accordance with a voltage on said first internal node;

selection circuitry connected between each of said plurality of voltage transmission lines and a second internal node, and responsive to a second select signal selecting one of said plurality of voltage transmission lines, for connecting the selected voltage transmission line to said second internal node;

a first coupling element connected between said driver and said pad, and responsive to said test mode designation signal being active, for coupling said driver to said pad; and a second coupling element connected between the second internal node and said pad, and responsive to the test mode designating signal being inactive, for coupling said second internal node to said pad.

9. A semiconductor integrated circuit device, comprising:

a plurality of voltage transmission lines each having an internal voltage at a predetermined voltage level transmitted thereon, a pad receiving an externally applied voltage, and connecting means provided between each of said plurality of voltage transmission lines and said pad, and responsive to a select signal for electrically coupling a voltage transmission line designated by the select signal to said pad.

10. The semiconductor integrated circuit device according to claim 9, wherein said select signal is brought to an active state in a test mode to designate either one of said plurality of voltage transmission lines.

11. The semiconductor integrated circuit device according to claim 9, further comprising:

selection circuitry provided between each of said plurality of voltage transmission lines and an internal node, and responsive to a second select signal for electrically connecting a voltage transmission line designated by the select signal to the internal node, and driving circuitry provided between said internal node and said pad for receiving a voltage on the voltage transmission line designated by said selection circuitry, and generating a voltage substantially at the same level as the received voltage for transmission to said pad.

12. The semiconductor integrated circuit device according to claim 9, wherein said connecting means includes selection circuitry coupled between each of said plurality of voltage transmission lines and said pad, and responsive to said select signal for connecting a corresponding one of said plurality of voltage transmission lines selected by said select signal to said pad.

13. The semiconductor integrated circuit device according to claim 9, wherein said connecting means includes:

selection circuits provided between said plurality of voltage transmission lines and an internal node, and responsive to a test mode designating signal for the select signal for coupling a voltage transmission line designated by said select signal out of said plurality of voltage transmission lines, and a connecting element connected between said internal node and said pad, and responsive to a test mode designation signal for connecting said internal node to said pad.

14. The semiconductor integrated circuit device according to claim 9, wherein said connecting means includes:

first selection circuitry connected between each of said plurality of voltage selection lines and a first internal node, and responsive to said select signal selecting one of said plurality of voltage transmission lines, for connecting the selected voltage transmission line to said first internal node, second selection circuitry connected between each of said plurality of voltage transmission lines and a second internal node, and responsive to a second select signal for connecting the selected voltage transmission line to the second internal node, a drive circuit provided between said second internal node and a third internal node, for generating a voltage at the same level as a voltage on the second internal node for transmission to said third internal node, a first coupling element connected between said first internal node and said pad, and responsive to a test mode designation signal being active, for coupling said first internal node to said pad, and a second coupling element connected between the third internal node and said pad, and responsive to a second test mode designation signal being active, for coupling said third internal node to said pad, the first and second coupling elements being made conductive complementarily to each other.

15. The semiconductor integrated circuit device according to claim 9, wherein said plurality of voltage transmission lines transmit the internal voltages at predetermined voltage levels different from each other.

16. The semiconductor integrated circuit device according to claim 9, wherein said plurality of voltage transmission lines each transmit a reference voltage at a constant voltage level as said internal voltage.

17. The semiconductor integrated circuit device according to claim 9, wherein said connecting means transfers the externally applied voltage to the selected voltage transmission line.

* * * * *